(12) United States Patent
Son

(10) Patent No.: US 12,439,597 B2
(45) Date of Patent: Oct. 7, 2025

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventor: Yong-Hoon Son, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 809 days.

(21) Appl. No.: 17/652,014

(22) Filed: Feb. 22, 2022

(65) Prior Publication Data

US 2022/0384478 A1 Dec. 1, 2022

(30) Foreign Application Priority Data

May 31, 2021 (KR) ..................... 10-2021-0070139

(51) Int. Cl.
  *H10B 43/27* (2023.01)
  *H01L 23/522* (2006.01)
  *H01L 23/528* (2006.01)
  *H10B 41/10* (2023.01)
  *H10B 41/27* (2023.01)
  *H10B 41/35* (2023.01)
  (Continued)

(52) U.S. Cl.
  CPC ......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 41/41* (2023.02); *H10B 43/10* (2023.02); *H10B 43/35* (2023.02); *H10B 43/40* (2023.02)

(58) Field of Classification Search
  CPC .............................. H10B 43/27; H10B 43/20
  See application file for complete search history.

(56) References Cited

U.S. PATENT DOCUMENTS 7,982,261 B2  7/2011  Kidoh et al.
9,627,401 B2  4/2017  Tsuda et al.
(Continued)

FOREIGN PATENT DOCUMENTS

CN  109698201 A  4/2019
CN  109712983 A  5/2019
(Continued)

*Primary Examiner* — Christopher A Johnson
(74) *Attorney, Agent, or Firm* — Wolf, Greenfield & Sacks, P.C.

(57) ABSTRACT

A three-dimensional semiconductor device may include a substrate including a cell array region and a contact region, a stack structure including interlayer dielectric layers and gate electrodes, a source structure, and a mold structure between the substrate and the stack structure. First vertical channel structures are on the cell array region in vertical channel holes. Each of the first vertical channel structures may include a first barrier pattern, a data storage pattern, and a vertical semiconductor pattern, which are sequentially layered on an inner side surface of one of the vertical channel holes. The mold structure may include a first buffer insulating layer, a first semiconductor layer, a second buffer insulating layer, and a second semiconductor layer sequentially stacked on the substrate. The source structure may be in physical contact with a portion of a side surface of the vertical semiconductor pattern.

20 Claims, 23 Drawing Sheets

(51) Int. Cl.
*H10B 41/41* (2023.01)
*H10B 43/10* (2023.01)
*H10B 43/35* (2023.01)
*H10B 43/40* (2023.01)

(56) References Cited

U.S. PATENT DOCUMENTS

| | | |
|---|---|---|
| 9,728,551 B1 | 8/2017 | Lu et al. |
| 2020/0266203 A1 | 8/2020 | Bhushan et al. |
| 2022/0037353 A1* | 2/2022 | Zhang ..................... H01L 25/50 |
| 2022/0068795 A1* | 3/2022 | Xue ........................ H10D 1/684 |

FOREIGN PATENT DOCUMENTS

| | | |
|---|---|---|
| CN | 112272868 A | 1/2021 |
| JP | 2016-092044 A | 5/2016 |
| KR | 10-2019-0058079 A | 5/2019 |
| KR | 10-2020-0078784 A | 7/2020 |
| KR | 10-2020-0132790 A | 11/2020 |
| KR | 1020200133686 A | 11/2020 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0070139, filed on May 31, 2021, in the Korean Intellectual Property Office, the entire contents of which are hereby incorporated by reference.

BACKGROUND OF THE INVENTION

The present disclosure relates to a three-dimensional semiconductor memory device and an electronic system including the same, and in particular, to a nonvolatile three-dimensional semiconductor memory device including a vertical channel structure, a method of fabricating the same, and an electronic system including the same.

A semiconductor device capable of storing a large amount of data may be used as a part of an electronic system. Higher integration of semiconductor devices may be used to satisfy consumer demands for large data storing capacity, superior performance, and inexpensive prices. In the case of two-dimensional or planar semiconductor devices, because their integration may be primarily determined by the area occupied by a unit memory cell, integration may be influenced by the level of a fine pattern forming technology. However, the extremely expensive process equipment used to increase pattern fineness may set a practical limitation on increasing integration for two-dimensional or planar semiconductor devices. Thus, three-dimensional semiconductor memory devices including three-dimensionally arranged memory cells have recently been proposed.

SUMMARY

Embodiments of the inventive concept provide a three-dimensional semiconductor memory device with improved reliability and electrical characteristics and a method of reducing process difficulty and cost in a process of fabricating a three-dimensional semiconductor memory device.

Embodiments of the inventive concept provide an electronic system including the three-dimensional semiconductor memory device.

According to an embodiment of the inventive concept, a three-dimensional semiconductor memory device may include a substrate including a cell array region and a contact region extending from the cell array region, a stack structure including interlayer dielectric layers and gate electrodes alternately and repeatedly stacked on the substrate, a source structure between the substrate on the cell array region and the stack structure, a mold structure between the substrate on the contact region and the stack structure, and first vertical channel structures on the cell array region that are in vertical channel holes penetrating the stack structure and the source structure. Each of the first vertical channel structures may include a first barrier pattern, a data storage pattern, and a vertical semiconductor pattern, which are sequentially layered on an inner side surface of a corresponding one of the vertical channel holes. The mold structure may include a first buffer insulating layer, a first semiconductor layer, a second buffer insulating layer, and a second semiconductor layer sequentially stacked on the substrate. The source structure may be in physical contact with a portion of a side surface of the vertical semiconductor pattern.

According to an embodiment of the inventive concept, a three-dimensional semiconductor memory device may include a first substrate including a cell array region and a contact region extending from the cell array region, a peripheral circuit structure including peripheral circuit transistors on the first substrate, a second substrate on the peripheral circuit structure, a stack structure including interlayer dielectric layers and gate electrodes, which are alternately and repeatedly stacked on the second substrate, a source structure between the second substrate on the cell array region and the stack structure, a mold structure between the second substrate on the contact region and the stack structure, first vertical channel structures on the cell array region that are in vertical channel holes penetrating the stack structure and the source structure, second vertical channel structures on the contact region that are in vertical channel holes penetrating the stack structure and the mold structure, an insulating layer on the stack structure, bit line contact plugs on the cell array region that penetrate the insulating layer and connected to the first vertical channel structures, respectively, cell contact plugs on the contact region that penetrate the insulating layer and connected to the gate electrodes, respectively, and a peripheral contact plug that penetrates the insulating layer, is connected to one of the peripheral circuit transistors, and spaced apart from the second substrate in a first direction generally parallel to a plane defined by the first substrate. Each of the first and second vertical channel structures may include a first barrier pattern, a data storage pattern, and a vertical semiconductor pattern, which are sequentially layered on an inner side surface of the vertical channel hole. The mold structure may include a first buffer insulating layer, a first semiconductor layer, a second buffer insulating layer, and a second semiconductor layer, which are sequentially stacked on the second substrate. The source structure may be in physical contact with a portion of a side surface of the vertical semiconductor pattern of each of the first vertical channel structures.

According to an embodiment of the inventive concept, an electronic system may include a three-dimensional semiconductor memory device including a first substrate, which includes a cell array region and a contact region extending from the cell array region, a peripheral circuit structure on the first substrate, a cell array structure on the peripheral circuit structure, an insulating layer on the cell array structure, and an input/output pad, which is on the insulating layer and is electrically connected to the peripheral circuit structure, and a controller, which is electrically connected to the three-dimensional semiconductor memory device through the input/output pad and is configured to control the three-dimensional semiconductor memory device. The cell array structure may include a second substrate on the peripheral circuit structure, a stack structure including interlayer dielectric layers and gate electrodes, which are alternately and repeatedly stacked on the second substrate, a source structure between the second substrate on the cell array region and the stack structure, a mold structure between the second substrate on the contact region and the stack structure, and vertical channel structures, which are on the cell array region in vertical channel holes penetrating the stack structure and the source structure. Each of the vertical channel structures may include a first barrier pattern, a data storage pattern, and a vertical semiconductor pattern, which are sequentially layered on an inner side surface of a corresponding one of the vertical channel holes. The mold structure may include a first buffer insulating layer, a first semiconductor layer, a second buffer insulating layer, and a second semiconductor layer, which are sequentially stacked on the second substrate, and the source structure may be in physical contact with a portion of a side surface of the vertical semiconductor pattern.

DETAILED DESCRIPTION

Example embodiments of the inventive concepts will now be described more fully with reference to the accompanying drawings, in which example embodiments are shown. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1:
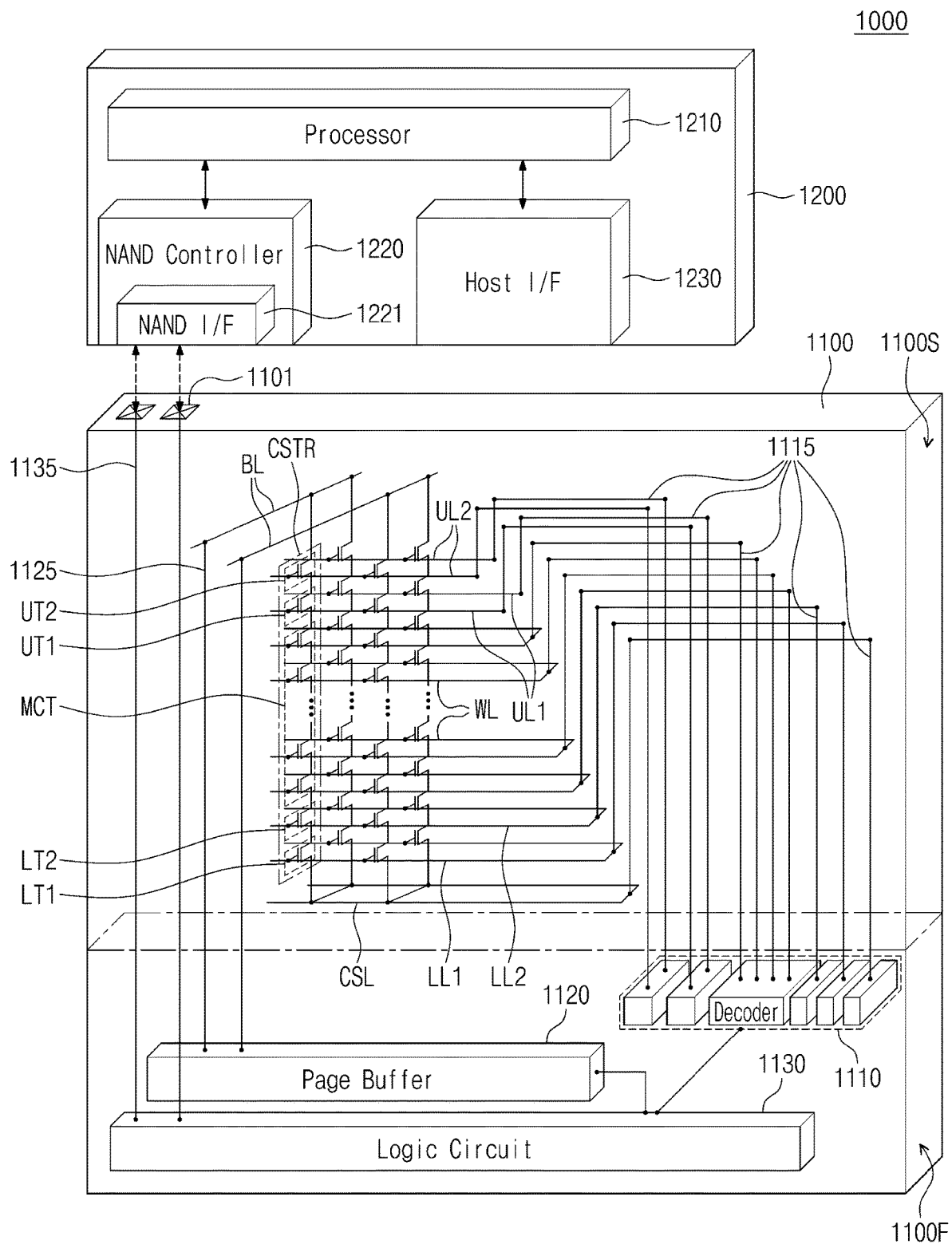
FIG. 1 is a diagram schematically illustrating an electronic system including a three-dimensional semiconductor memory device, according to an embodiment of the inventive concept.

FIG. 1 is a diagram schematically illustrating an electronic system including a three-dimensional semiconductor memory device, according to an embodiment of the inventive concept.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, and/or a communication system, in which at least one three-dimensional semiconductor memory devices 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. For example, the first region 1100F may be disposed near the second region 1100S. The first region 1100F may be a peripheral circuit region, which includes a decoder circuit 1110, a page buffer 1120, and a logic circuit 1130. The second region 1100S may be a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to different embodiments.

In an embodiment, the first transistors LT1 and LT2 may include a ground selection transistor, and the second transistors UT1 and UT2 may include a string selection transistor. The first lines LL1 and LL2 may serve as gate electrodes of the first transistors LT1 and LT2, respectively. The word lines WL may serve as gate electrodes of the memory cell transistors MCT. The second lines UL1 and UL2 may serve as gate electrodes of the second transistors UT1 and UT2, respectively.

In an embodiment, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which extend from the first region 1100F to the second region 1100S. The bit line BL may be electrically connected to the page buffer 1120 through second interconnection lines 1125, which extend from the first region 1100F to the second region 1100S.

In the first region 1100F, the decoder circuit 1110 and the page buffer 1120 may be configured to perform a control operation, which is performed a selection of one or more of the memory cell transistors MCT. The decoder circuit 1110 and the page buffer 1120 may be controlled by the logic circuit 1130. The three-dimensional semiconductor memory device 1100 may be configured to communicate with the controller 1200 through an input/output pad 1101, which is electrically connected to the logic circuit 1130. The input/output pad 1101 may be electrically connected to the logic circuit 1130 through an input/output interconnection line 1135, which extends from the first region 1100F to the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may be configured to control the three-dimensional semiconductor memory devices 1100.

The processor 1210 may be configured to control overall operations of the electronic system 1000 including the controller 1200. Based on a specific firmware, the processor 1210 may be configured to execute operations of controlling the NAND controller 1220 and accessing the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands, which are used to control the three-dimensional semiconductor memory device 1100, data, which may be written in or read from the memory cell transistors MCT of the three-dimensional semiconductor memory device 1100, and so forth. The host interface 1230 may be configured to allow for communication between the electronic system 1000 and an external host. If a control command is received from an external host through the host interface 1230, the processor 1210 may be configured to control the three-dimensional semiconductor memory device 1100 in response to the control command.

Figure 2:
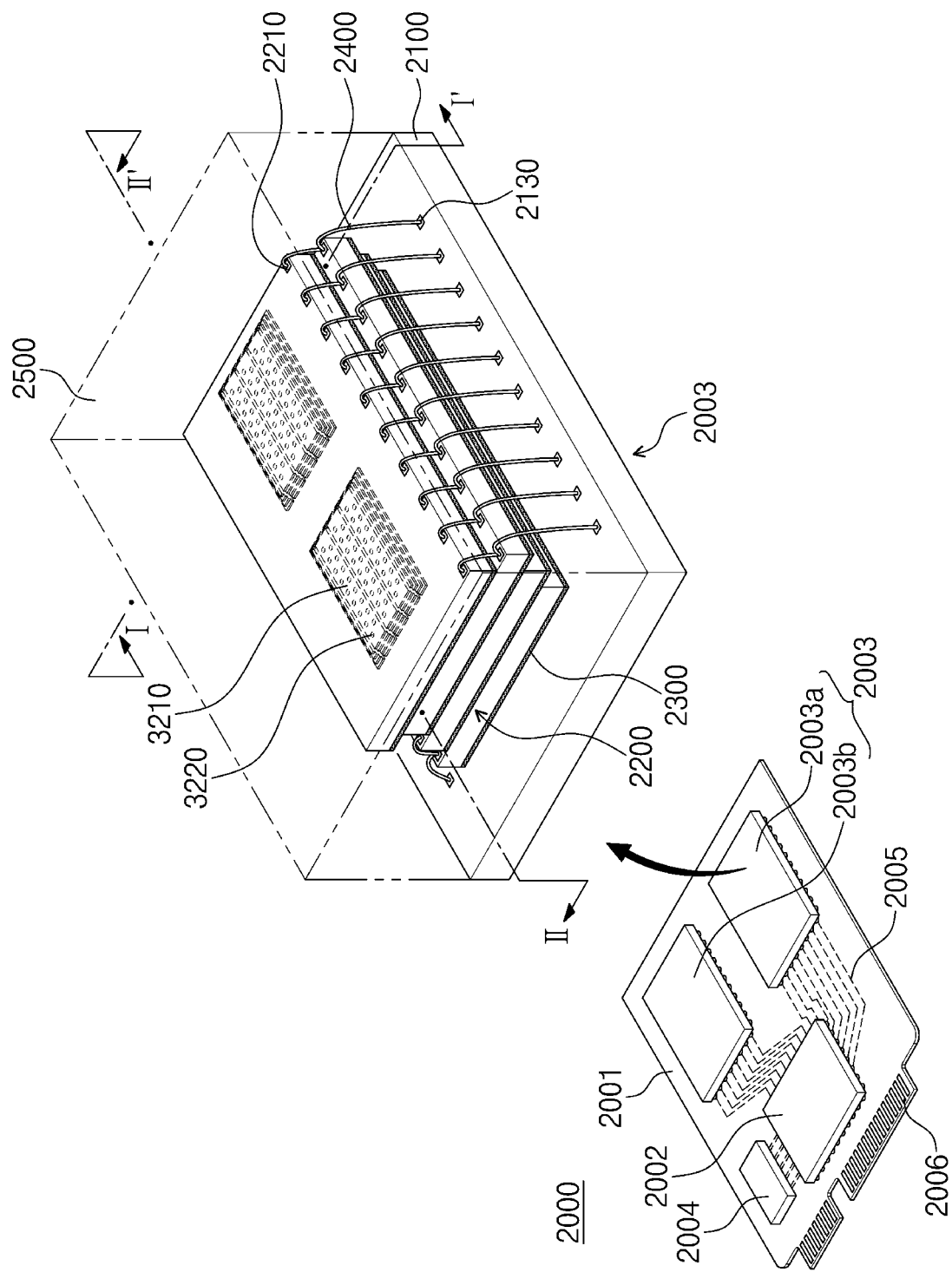
FIG. 2 is a perspective view schematically illustrating an electronic system including a three-dimensional semiconductor memory device, according to an embodiment of the inventive concept.

FIG. 2 is a perspective view schematically illustrating an electronic system including a three-dimensional semiconductor memory device, according to an embodiment of the inventive concept.

Referring to FIG. 2, an electronic system 2000 may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an embodiment, the electronic system 2000 may be driven by electrical power, which is supplied from the external host through the connector 2006. The electronic system 2000 may further include a power management integrated circuit (PMIC), which is used to distribute power supplied from the external host to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which may relieve technical difficulties caused by a difference in speed between the semiconductor package 2003, which serves as a data storage device, and an external host. In an embodiment, the DRAM 2004 in the electronic system 2000 may serve as a cache memory and may provide a storage space, for temporarily storing data during various control operations performed on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to at least partially cover the semiconductor chips 2200 and the connection structure 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device, which will be described below.

In an embodiment, the connection structure 2400 may be a bonding wire electrically connecting the input/output pads 2210 to the package upper pads 2130. In each of the first and second semiconductor packages 2003a and 2003b, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003a and 2003b may be electrically connected to each other by through silicon vias (TSVs), not by the connection structure 2400 provided in the form of bonding wires.

In an embodiment, the controller 2002 and the semiconductor chips 2200 may be included in a single package. For example, the controller 2002 and the semiconductor chips 2200 may be mounted on an interposer substrate, which is prepared independent of the main substrate 2001, and may be connected to each other through interconnection lines, which are provided in the interposer substrate.

Figure 3:
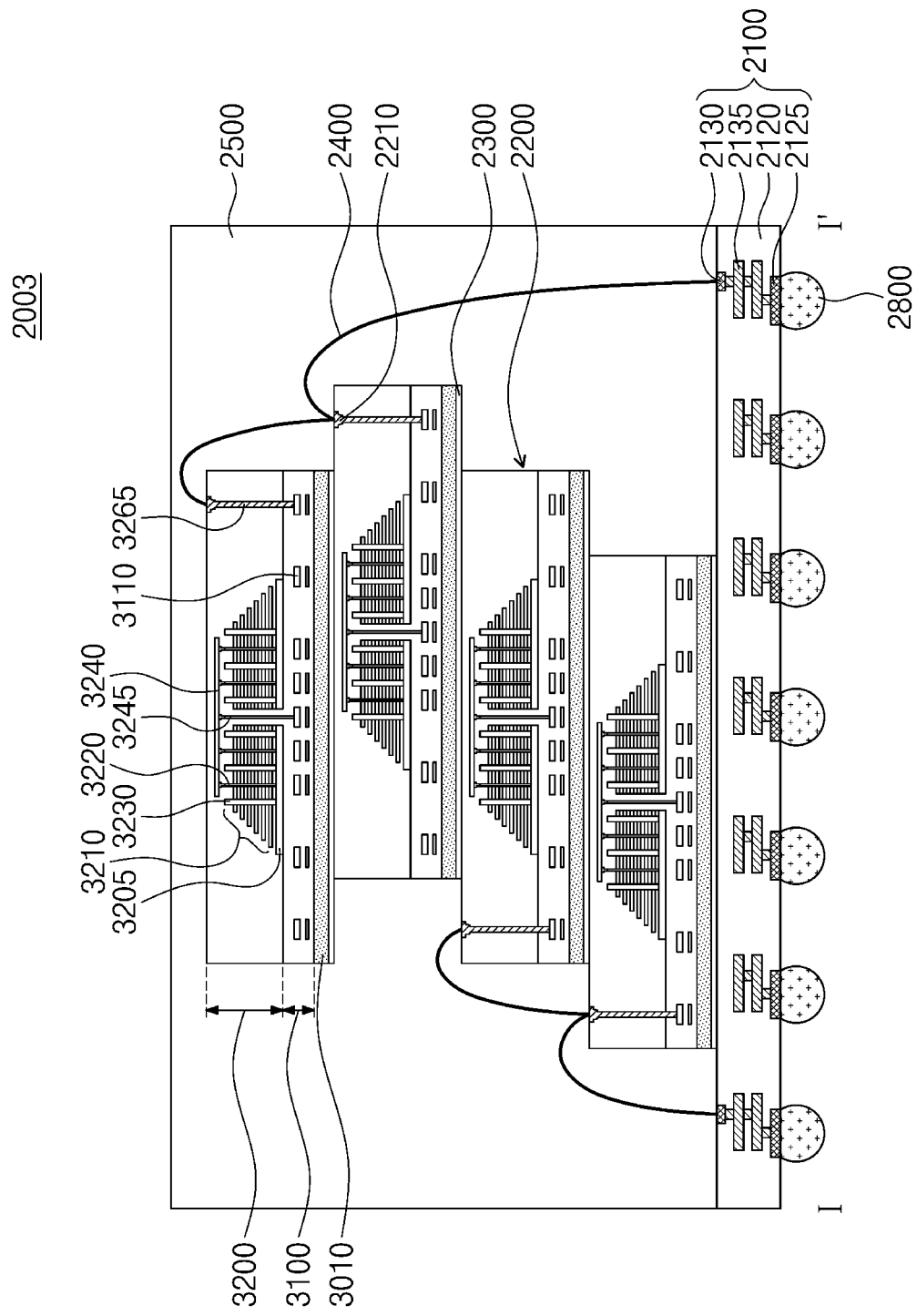
FIGS. 3 and 4 are sectional views, which are respectively taken along lines I-I' and II-II' of FIG. 2 that illustrate a semiconductor package including a three-dimensional semiconductor memory device, according to an embodiment of the inventive concept.
Figure 4:
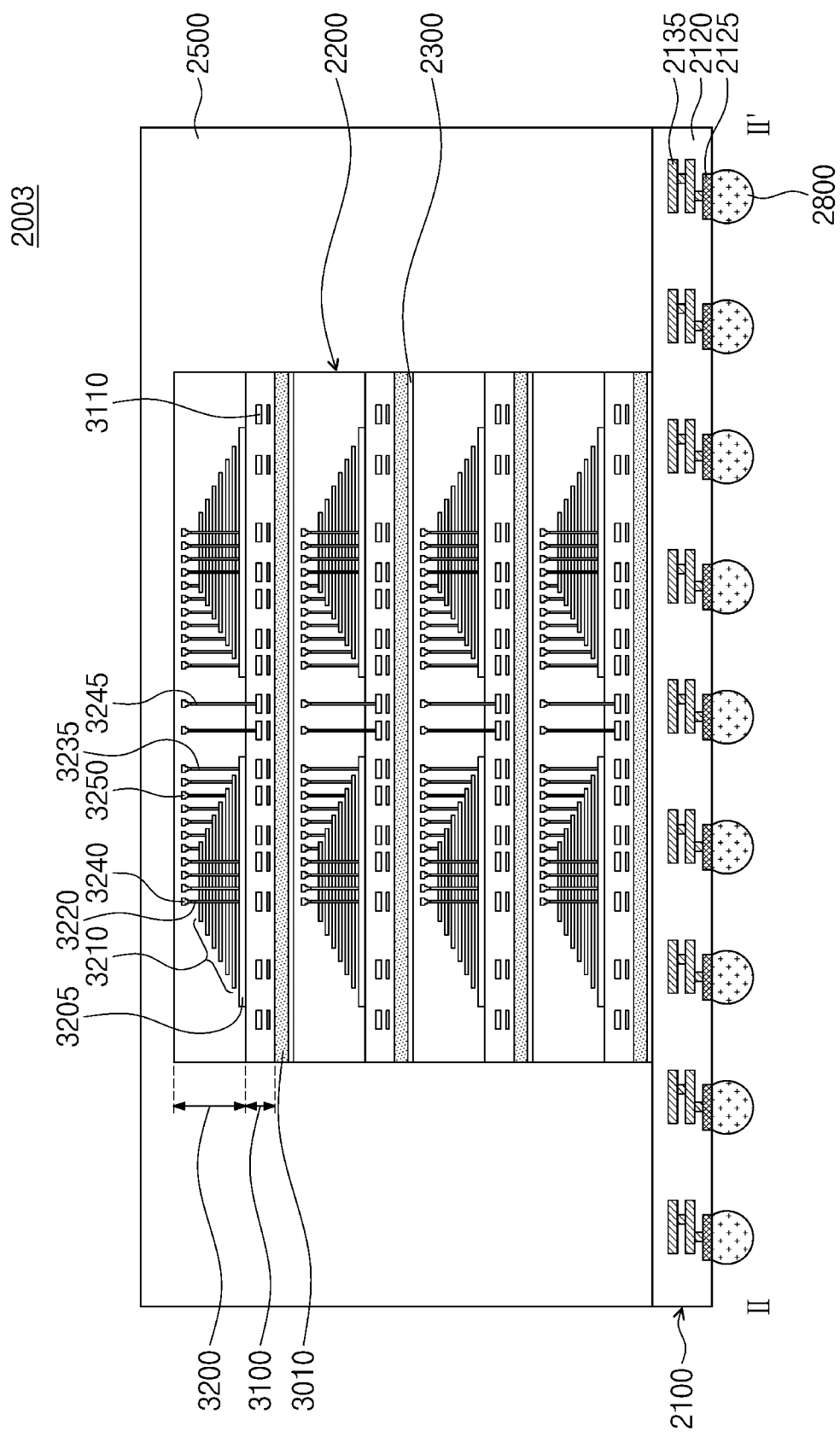

FIGS. 3 and 4 are sectional views, which are respectively taken along lines I-I' and II-II' of FIG. 2, that illustrate a semiconductor package including a three-dimensional semiconductor memory device, according to an embodiment of the inventive concept.

Referring to FIGS. 3 and 4, the semiconductor package 2003 may include the package substrate 2100, a plurality of semiconductor chips on the package substrate 2100, and the molding layer 2500 on and at least partially covering the package substrate 2100 and the semiconductor chips.

The package substrate 2100 may include a package substrate body portion 2120, the package upper pads 2130 disposed on a top surface of the package substrate body portion 2120, lower pads 2125 disposed on or exposed through a bottom surface of the package substrate body portion 2120, and internal lines 2135 provided in the package substrate body portion 2120 to electrically connect the upper pads 2130 to the lower pads 2125. The package upper pads 2130 may be electrically connected to the connection structures 2400. The lower pads 2125 may be connected to the interconnection patterns 2005 of the main substrate 2001 of the electronic system 2000 shown in FIG. 2 through conductive connecting portions 2800.

Each of the semiconductor chips 2200 may include a semiconductor substrate 3010, a first structure 3100, and a second structure 3200, which are sequentially stacked on the semiconductor substrate 3010. The first structure 3100 may include a peripheral circuit region, in which peripheral lines 3110 are provided. The second structure 3200 may include a common source line 3205, the gate stack structure 3210 on the common source line 3205, the vertical channel structures 3220 and separation structures 3230 penetrating the gate stack structure 3210, bit lines 3240 electrically connected to the vertical channel structures 3220, gate connection lines 3235 electrically connected to the word lines WL (e.g., see FIG. 1) of the gate stack structure 3210, and conductive lines 3250.

Each of the semiconductor chips 2200 may be electrically connected to the peripheral lines 3110 of the first structure 3100 and may include a penetration line 3245, which extends into the second structure 3200. The penetration line 3245 may penetrate the gate stack structure 3210 and may be disposed outside the gate stack structure 3210. Each of the semiconductor chips 2200 may be electrically connected to the peripheral lines 3110 of the first structure 3100 and may further include an input/output connection line 3265, which extends into the second structure 3200, and the input/output pad 2210, and which is electrically connected to the input/output connection line 3265.

Figure 5:
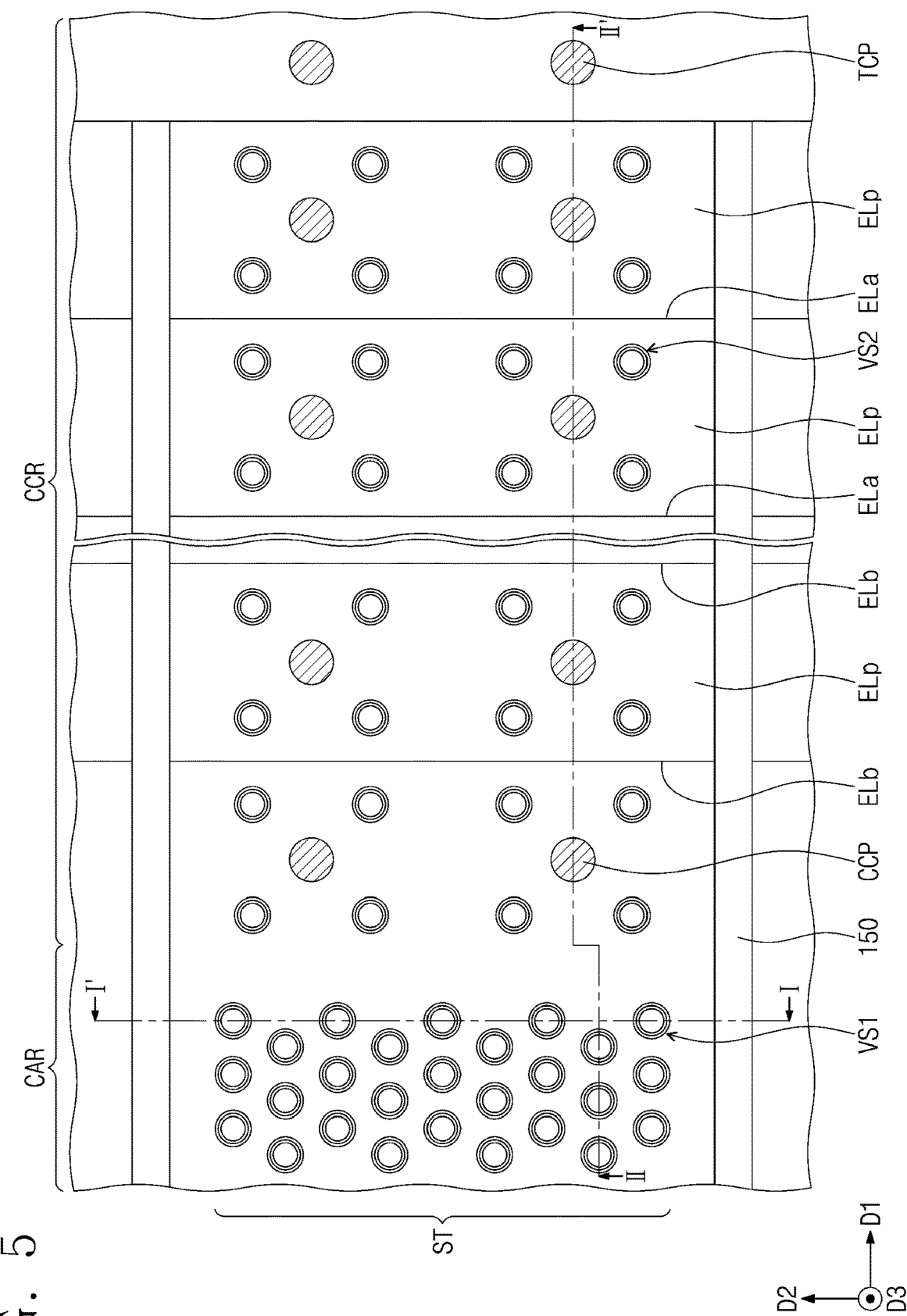
FIG. 5 is a plan view illustrating a three-dimensional semiconductor memory device according to an embodiment of the inventive concept.
Figure 6A:
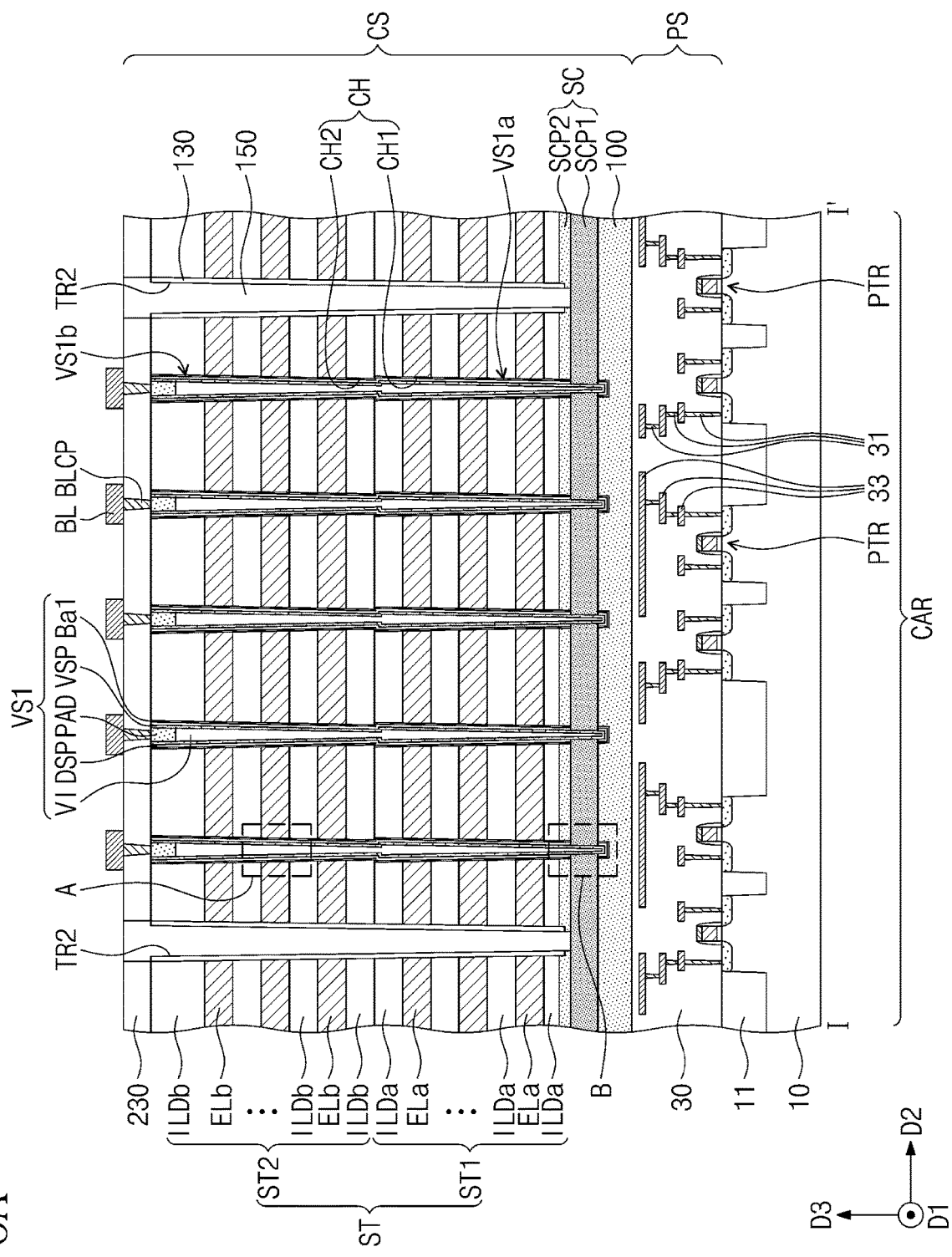
FIGS. 6A and 6B are sectional views, which are respectively taken along lines I-I' and II-II' of FIG. 5 that illustrate a three-dimensional semiconductor memory device according to an embodiment of the inventive concept.
Figure 6B:
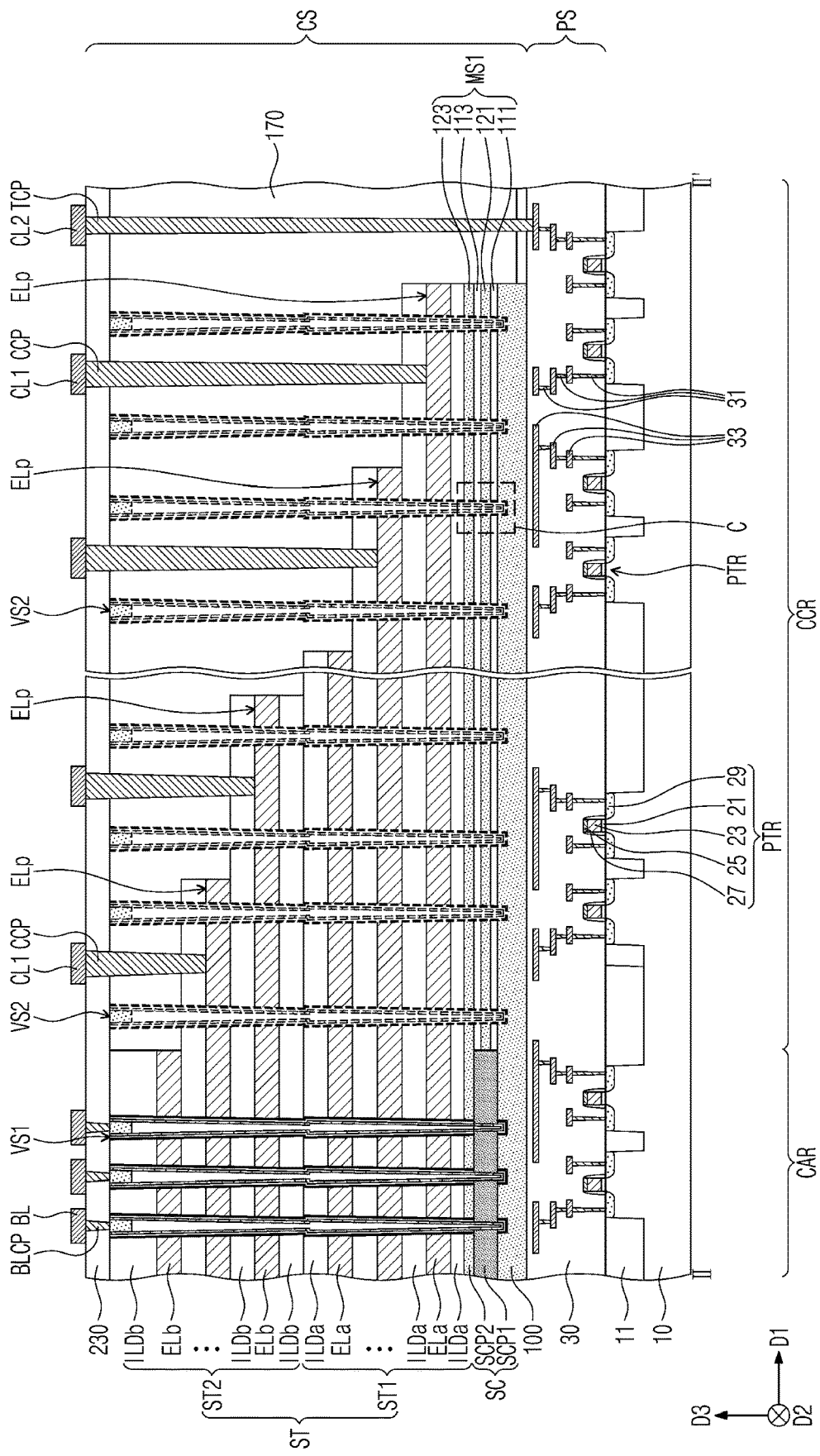

FIG. 5 is a plan view illustrating a three-dimensional semiconductor memory device according to an embodiment of the inventive concept. FIGS. 6A and 6B are sectional views, which are respectively taken along lines I-I' and II-II' of FIG. 5, to illustrate a three-dimensional semiconductor memory device according to an embodiment of the inventive concept.

Referring to FIGS. 5, 6A, and 6B, a three-dimensional semiconductor memory device may include a first substrate 10, a peripheral circuit structure PS on the first substrate 10, and a cell array structure CS on the peripheral circuit structure PS. The first substrate 10, the peripheral circuit structure PS, and the cell array structure CS may correspond to the semiconductor substrate 3010, the first structure 3100 on the semiconductor substrate 3010, and the second structure 3200 on the first structure 3100, respectively, which are illustrated in FIGS. 3 and 4.

The first substrate 10 may include a cell array region CAR and a contact region CCR, which are arranged in a first direction D1. The first substrate 10 may extend in the first direction D1 and in a second direction D2 crossing the first direction D1. A top surface of the first substrate 10 may be perpendicular to a third direction D3 crossing the first and second directions D1 and D2. For example, the first direction D1, the second direction D2, and the third direction D3 may be orthogonal to each other.

When viewed in a plan view, the contact region CCR may extend from the cell array region CAR in the first direction D1 or an opposite direction of the first direction D1. The cell array region CAR may be a region, on which the vertical channel structures 3220 described with reference to FIGS. 3 and 4, the separation structures 3230, and the bit lines 3240 electrically connected to the vertical channel structures 3220 are provided. The contact region CCR may be a region on which a stepwise structure including pad portions ELp to be described below is provided. Unlike that illustrated in the drawings, the contact region CCR may extend from the cell array region CAR in the second direction D2 or an opposite direction of the second direction D2.

In an embodiment, the first substrate 10 may be a silicon substrate, a silicon-germanium substrate, a germanium substrate, or a structure including a single-crystalline silicon substrate and a single crystalline epitaxial layer grown therefrom. A device isolation layer 11 may be provided in the first substrate 10. The device isolation layer 11 may define an active region of the first substrate 10. The device isolation layer 11 may be formed of or include, for example, silicon oxide.

The peripheral circuit structure PS may be provided on the first substrate 10. The peripheral circuit structure PS may include peripheral circuit transistors PTR on the active region of the first substrate 10, peripheral contact plugs 31, peripheral circuit interconnection lines 33 electrically connected to the peripheral circuit transistors PTR through the peripheral contact plugs 31, and a first insulating layer 30 at least partially enclosing these elements. The peripheral circuit structure PS may correspond to the first region 1100F of FIG. 1, and the peripheral circuit interconnection lines 33 may correspond to the peripheral lines 3110 of FIGS. 3 and 4.

The peripheral circuit transistors PTR, the peripheral contact plugs 31, and the peripheral circuit interconnection lines 33 may constitute a peripheral circuit. For example, the peripheral circuit transistors PTR may constitute the decoder circuit 1110, the page buffer 1120, and the logic circuit 1130 of FIG. 1. More specifically, each of the peripheral circuit transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may be on and at least partially cover side surfaces of the peripheral gate insulating layer 21, the peripheral gate electrode 23, and the peripheral capping pattern 25. The peripheral source/drain regions 29 may be provided in portions of the first substrate 10, which are located at both sides of the peripheral gate electrode 23.

The peripheral circuit interconnection lines 33 may be electrically connected to the peripheral circuit transistors PTR through the peripheral contact plugs 31. Each of the peripheral circuit transistors PTR may be an NMOS transistor or a PMOS transistor and, in an embodiment, one or more of the peripheral circuit transistors PTR may be a gate-all-around type transistor. A width of each of the peripheral contact plugs 31 in the first or second direction D1 or D2 may increase with increasing distance from the first substrate 10. The peripheral contact plugs 31 and the peripheral circuit interconnection lines 33 may be formed of or include at least one conductive material (e.g., metallic materials).

The first insulating layer 30 may be provided on the top surface of the first substrate 10. The first insulating layer 30 may be provided on the first substrate 10 to be on and at least partially cover the peripheral circuit transistors PTR, the peripheral contact plugs 31, and the peripheral circuit interconnection lines 33. The first insulating layer 30 may have a multi-layered structure including a plurality of insulating layers. For example, the first insulating layer 30 may include at least one of silicon oxide, silicon nitride, silicon oxynitride, and/or low-k dielectric materials.

The cell array structure CS may be provided on the first insulating layer 30, and here, the cell array structure CS may include a second substrate 100 and a stack structure ST on the second substrate 100. The second substrate 100 may extend in the first and second directions D1 and D2. The second substrate 100 may not be provided on a portion of the contact region CCR. The second substrate 100 may be a semiconductor substrate including a semiconductor material. The second substrate 100 may be formed of or include at least one of silicon (Si), germanium (Ge), silicon germanium (SiGe), gallium arsenic (GaAs), indium gallium arsenic (InGaAs), and/or aluminum gallium arsenic (AlGaAs).

The stack structure ST may be provided on the second substrate 100. The stack structure ST may extend from the cell array region CAR to the contact region CCR. The stack structure ST may correspond to the stack structures 3210 of FIGS. 3 and 4. In an embodiment, a plurality of the stack structures ST may be arranged in the second direction D2 and may be spaced apart from each other in the second direction D2 with a separation structure 150 interposed therebetween. For brevity's sake, just one stack structure ST will be described below, but other ones of the stack structures ST may also have substantially the same features as described below.

The stack structure ST may include interlayer dielectric layers ILDa and ILDb and gate electrodes ELa and ELb, which are alternately and repeatedly stacked. The gate electrodes ELa and ELb may correspond to the word lines WL, the first lines LL1 and LL2, and the second lines UL1 and UL2 of FIG. 1.

More specifically, the stack structure ST may include a first stack structure ST1 on the second substrate 100 and a second stack structure ST2 on the first stack structure ST1. The first stack structure ST1 may include first interlayer dielectric layers ILDa and first gate electrodes ELa, which are alternately and repeatedly stacked, and the second stack structure ST2 may include second interlayer dielectric layers ILDb and second gate electrodes ELb, which are alternately and repeatedly stacked. The first and second gate electrodes ELa and ELb may have substantially the same thickness in the third direction D3. Hereinafter, the term 'thickness' may be used to represent a length of an element in the third direction D3.

For the first and second gate electrodes ELa and ELb, a length in the first direction D1 may decrease with increasing distance from the second substrate 100 (i.e., with increasing distance in the third direction D3). That is, a length of each of the first and second gate electrodes ELa and ELb in the first direction D1 may be larger than a length of another electrode thereon in the first direction D1. The lowermost one of the first gate electrodes ELa of the first stack structure ST1 may have the largest length in the first direction D1, and the uppermost one of the second gate electrodes ELb of the second stack structure ST2 may have the smallest length in the first direction D1.

The first and second gate electrodes ELa and ELb may have the pad portions ELp, on the contact region CCR. The pad portions ELp of the first and second gate electrodes ELa and ELb may be disposed at positions that are different from each other in horizontal and vertical directions in the cross-sectional views of FIGS. 6A and 6B. The pad portions ELp may form a stepwise structure in the first direction D1.

Due to the stepwise structure, each of the first and second stack structures ST1 and ST2 may have a thickness decreasing with increasing distance from the outermost one of first vertical channel structures VS1 to be described below, and the side surfaces of the first and second gate electrodes ELa and ELb may be spaced apart from each other in the first direction D1 by a specific distance, when viewed in a plan view.

The first and second gate electrodes ELa and ELb may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), and/or transition metals (e.g., titanium, tantalum, and so forth). In an embodiment, the first and second gate electrodes ELa and ELb may be formed of or include tungsten.

The first and second interlayer dielectric layers ILDa and ILDb may be provided between the first and second gate electrodes ELa and ELb and each of these dielectric layers ILDa and ILDb may have a side surface that is aligned to a side surface of a corresponding one of the first and second gate electrodes ELa and ELb, which is disposed thereunder and is in physical contact therewith. In other words, the first and second interlayer dielectric layers ILDa and ILDb may be provided such that a length in the first direction D1 decreases with increasing distance from the second substrate 100, similar to the first and second gate electrodes ELa and ELb.

The lowermost one of the second interlayer dielectric layers ILDb may be in physical contact with the uppermost one of the first interlayer dielectric layers ILDa. In an embodiment, a thickness of each of the first and second interlayer dielectric layers ILDa and ILDb may be smaller than a thickness of each of the first and second gate electrodes ELa and ELb. The lowermost one of the first interlayer dielectric layers ILDa may be thinner than other ones of the interlayer dielectric layers ILDa and ILDb. For example, the uppermost one of the second interlayer dielectric layers ILDb may be thicker than other ones of the interlayer dielectric layers ILDa and ILDb.

Except for the lowermost one of the first interlayer dielectric layers ILDa and the uppermost one of the second interlayer dielectric layers ILDb, the remaining ones of the interlayer dielectric layers ILDa and ILDb may have substantially the same thickness. However, embodiments of the inventive concept are not limited to this example, and the thicknesses of the first and second interlayer dielectric layers ILDa and ILDb may be variously changed depending on requirements for the semiconductor device.

The first and second interlayer dielectric layers ILDa and ILDb may be formed of or include at least one of, for example, silicon oxide, silicon nitride, silicon oxynitride, and/or low-k dielectric materials. For example, the first and second interlayer dielectric layers ILDa and ILDb may be formed of or include high density plasma (HDP) oxide and/or tetraethylorthosilicate (TEOS).

A source structure SC may be provided between the second substrate 100 on the cell array region CAR and the lowermost one of the first interlayer dielectric layers ILDa. The source structure SC may correspond to the common source line CSL of FIG. 1 and the common source line 3205 of FIGS. 3 and 4. The source structure SC may include a first source conductive pattern SCP1 and a second source conductive pattern SCP2, which are sequentially stacked on the second substrate 100. The second source conductive pattern SCP2 may be provided between the first source conductive pattern SCP1 and the lowermost one of the first interlayer dielectric layers ILDa. A thickness of the first source conductive pattern SCP1 may be larger than a thickness of the second source conductive pattern SCP2. The first and second source conductive patterns SCP1 and SCP2 may be formed of or include a semiconductor material (e.g., silicon) and/or a doped semiconductor material. In the case where the first and second source conductive patterns SCP1 and SCP2 include the doped semiconductor material, an impurity concentration of the first source conductive pattern SCP1 may be higher than an impurity concentration of the second source conductive pattern SCP2.

The first source conductive pattern SCP1 of the source structure SC may be provided on only the cell array region CAR, but not on the contact region CCR. By contrast, the second source conductive pattern SCP2 of the source structure SC may extend from the cell array region CAR to the contact region CCR. The second source conductive pattern SCP2 on the contact region CCR may be referred to as a second semiconductor layer 123.

A first mold structure MS1 may be provided between the second substrate 100 on the contact region CCR and the lowermost one of the first interlayer dielectric layers ILDa. The first mold structure MS1 may include a first buffer insulating layer 111, a first semiconductor layer 121, a second buffer insulating layer 113, and the second semiconductor layer 123, which are sequentially stacked on the second substrate 100.

The first semiconductor layer 121 may be provided between the second substrate 100 and the second semiconductor layer 123. The first buffer insulating layer 111 may be provided between the second substrate 100 and the first semiconductor layer 121, and the second buffer insulating layer 113 may be provided between the first semiconductor layer 121 and the second semiconductor layer 123. A bottom surface of the first buffer insulating layer 111 may be substantially coplanar with a bottom surface of the first source conductive pattern SCP1. A top surface of the second buffer insulating layer 113 may be substantially coplanar with a top surface of the first source conductive pattern SCP1.

In an embodiment, the first and second buffer insulating layers 111 and 113 may be formed of or include silicon oxide. The first and second semiconductor layers 121 and 123 may be formed of or include a material having an etch selectivity with respect to a first barrier pattern Ba1. For example, the first and second semiconductor layers 121 and 123 may be formed of or include a semiconductor material (e.g., silicon).

The first vertical channel structures VS1 may be provided to penetrate the stack structure ST and the source structure SC on the cell array region CAR. The first vertical channel structures VS1 may be provided to penetrate at least a portion of the second substrate 100, and a bottom surface of each of the first vertical channel structures VS1 may be located at a level lower than a top surface of the second substrate 100 and a bottom surface of the source structure SC in the cross-sectional views of FIGS. 6A and 6B. In other words, the first vertical channel structures VS1 may be in direct contact with the second substrate 100.

The first vertical channel structures VS1 may be arranged to form a zigzag shape in the first or second direction D1 or D2, when viewed in the plan view of FIG. 5. The first vertical channel structures VS1 may not be provided on the contact region CCR. The first vertical channel structures VS1 may correspond to the vertical channel structures 3220 of FIGS. 2 to 4. The first vertical channel structures VS1 may correspond to the channel regions of the first transistors LT1 and LT2, the memory cell transistors MCT, and the second transistors UT1 and UT2 of FIG. 1.

The first vertical channel structures VS1 may be provided in vertical channel holes CH penetrating the stack structure ST. Each of the vertical channel holes CH may include a first vertical channel hole CH1 penetrating the first stack structure ST1 and a second vertical channel hole CH2 penetrating the second stack structure ST2. The first and second vertical channel holes CH1 and CH2 of each of the vertical channel holes CH may be connected to each other in the third direction D3.

Each of the first vertical channel structures VS1 may include a first portion VS1a and a second portion VS1b. The first portion VS1a may be provided in the first vertical channel hole CH1, and the second portion VS1b may be provided in the second vertical channel hole CH2. The second portion VS1b may be disposed on and connected to the first portion VS1a.

For each of the first and second portions VS1a and VS1b, a width in the first or second direction D1 or D2 may increase with increasing distance in the third direction D3. The uppermost width of the first portion VS1a may be larger than the lowermost width of the second portion VS1b. In other words, a side surface of each of the first vertical channel structures VS1 may have a stepped structure near a boundary between the first portion VS1a and the second portion VS1b. However, embodiments of the inventive concept are not limited to this example, and in an embodiment, the side surface of each of the first vertical channel structures VS1 may have three or more stepped portions at different levels or may have a flat shape without a stepped portion.

Each of the first vertical channel structures VS1 may include a first barrier pattern Ba1, a data storage pattern DSP, and a vertical semiconductor pattern VSP, which are sequentially provided on an inner side surface of each of the vertical channel holes CH, an insulating gapfill pattern VI, which is provided to at least partially fill an internal space of the vertical semiconductor pattern VSP, and a conductive pad PAD, which is provided on the insulating gapfill pattern VI. The conductive pad PAD may be provided in an empty space, which is defined by or enclosed by the insulating gapfill pattern VI and the data storage pattern DSP (or the vertical semiconductor pattern VSP). In an embodiment, a top surface of each of the first vertical channel structures VS1 may have a circular, elliptical, or bar shape. The first barrier pattern Ba1 may be disposed adjacent to the stack structure ST to be on and at least partially cover the side surfaces of the first and second interlayer dielectric layers ILDa and ILDb and the side surfaces of the first and second gate electrodes ELa and ELb. The data storage pattern DSP may be provided to be on and at least partially conformally cover an inner side surface of the first barrier pattern Ba1. The vertical semiconductor pattern VSP may be provided to be on and at least partially conformally cover an inner side surface of the data storage pattern DSP.

The data storage pattern DSP may be provided between the first barrier pattern Ba1 and the vertical semiconductor pattern VSP. The vertical semiconductor pattern VSP may be provided between the data storage pattern DSP and the insulating gapfill pattern VI. The vertical semiconductor pattern VSP may be shaped like a bottom-closed pipe or macaroni. The first barrier pattern Ba1 and the data storage pattern DSP may be shaped like a bottom-opened pipe or macaroni.

The first barrier pattern Ba1 may be formed of or include one or more high-k dielectric materials whose dielectric constants are higher than silicon oxide and silicon nitride. The first barrier pattern Ba1 may be formed of or include at least one of, for example, hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate. In an embodiment, the first barrier pattern Ba1 may be formed of or include at least one of aluminum oxide and/or hafnium oxide.

The vertical semiconductor pattern VSP may be formed of or include one or more doped semiconductor materials or undoped or intrinsic semiconductor materials and may have a poly-crystalline or single-crystalline structure. As will be described with reference to FIG. 7B, the vertical semiconductor pattern VSP may be in physical contact with a portion of the source structure SC. The conductive pad PAD may be formed of or include at least one of doped semiconductor materials and/or conductive materials.

A plurality of second vertical channel structures VS2 may be provided on the contact region CCR to penetrate a second insulating layer 170, the stack structure ST, and the first mold structure MS1. More specifically, the second vertical channel structures VS2 may be provided to penetrate the pad portions ELp of the first and second gate electrodes ELa and ELb. The second vertical channel structures VS2 may be provided near cell contact plugs CCP, which will be described below. The second vertical channel structures VS2 may not be provided on the cell array region CAR. The first and second vertical channel structures VS1 and VS2 may be formed at the same time and may have substantially the same structure. However, in certain embodiments, the second vertical channel structures VS2 may not be provided.

The second insulating layer 170 may be provided on the contact region CCR to at least partially cover the stack structure ST and a portion of the first insulating layer 30. More specifically, the second insulating layer 170 may be provided on the pad portions ELp of the first and second gate electrodes ELa and ELb to at least partially cover the stepwise structure of the stack structure ST. The second insulating layer 170 may have a substantially flat top surface. The top surface of the second insulating layer 170 may be substantially coplanar with the topmost surface of the stack structure ST. More specifically, the top surface of the second insulating layer 170 may be substantially coplanar with a top surface of the uppermost one of the second interlayer dielectric layers ILDb of the stack structure ST.

The second insulating layer 170 may include an insulating layer or a plurality of stacked insulating layers. The second insulating layer 170 may be formed of or include one or more insulating materials (e.g., silicon oxide, silicon nitride, silicon oxynitride, and/or low-k dielectric materials). The second insulating layer 170 may be formed of or include an insulating material different from the first and second interlayer dielectric layers ILDa and ILDb of the stack structure ST. In the case where the first and second interlayer dielectric layers ILDa and ILDb of the stack structure ST include high-density plasma oxide, the second insulating layer 170 may be formed of or include TEOS.

A third insulating layer 230 may be provided on the second insulating layer 170 and the stack structure ST. The third insulating layer 230 may be on and at least partially cover the top surface of the second insulating layer 170, the top surface of the uppermost one of the second interlayer dielectric layers ILDb of the stack structure ST, and the top surfaces of the first and second vertical channel structures VS1 and VS2.

The third insulating layer 230 may include an insulating layer or a plurality of stacked insulating layers. The third insulating layer 230 may be formed of or include at least one of, for example, silicon oxide, silicon nitride, silicon oxynitride, and/or low-k dielectric materials. The third insulating layer 230 may be formed of or include substantially the same insulating material as the second insulating layer 170 and may include an insulating material different from the first and second interlayer dielectric layers ILDa and ILDb of the stack structure ST.

Bit line contact plugs BLCP may be provided to penetrate the third insulating layer 230 and may be connected to the first vertical channel structures VS1. The cell contact plugs CCP may be provided to penetrate the third insulating layer 230 and the second insulating layer 170 and may be connected to the first and second gate electrodes ELa and ELb. Each of the cell contact plugs CCP may be provided to penetrate one of the first and second interlayer dielectric layers ILDa and ILDb and may be in direct contact with one of the pad portions ELp of the first and second gate electrodes ELa and ELb. Each of the cell contact plugs CCP may be adjacent to a plurality of the second vertical channel structures VS2 and may be spaced apart from each other. The cell contact plugs CCP may correspond to the gate connection lines 3235 of FIG. 4.

A peripheral contact plug TCP may be provided to penetrate the third insulating layer 230, the second insulating layer 170, and at least a portion of a peripheral circuit insulating layer 30 and may be electrically connected to the peripheral circuit transistor PTR of the peripheral circuit structure PS. A plurality of the peripheral contact plugs TCP may be provided, unlike that illustrated in the drawings. The peripheral contact plug TCP may be spaced apart from the second substrate 100, the source structure SC, and the stack structure ST in the first direction D1. The peripheral contact plug TCP may correspond to the penetration line 3245 of FIGS. 3 and 4.

For the bit line contact plugs BLCP, the cell contact plugs CCP, and the peripheral contact plug TCP, a width in the first or second direction D1 or D2 may increase with increasing distance in the third direction D3.

The bit lines BL may be provided on the third insulating layer 230 and may be connected to the bit line contact plugs BLCP, respectively. The bit lines BL may correspond to the bit line BL of FIG. 1 and the bit lines 3240 of FIGS. 3 and 4.

First conductive lines CL1 connected to the cell contact plugs CCP and second conductive line CL2 connected to the peripheral contact plug TCP may be provided on the third insulating layer 230. The first and second conductive lines CL1 and CL2 may correspond to the conductive lines 3250 of FIG. 4.

The bit line contact plugs BLCP, the cell contact plugs CCP, the peripheral contact plug TCP, the bit lines BL, and the first and second conductive lines CL1 and CL2 may be formed of or include one or more conductive materials (e.g., metallic materials). Although not shown, the bit lines BL, additional interconnection lines and additional vias, which are electrically connected to the first and second conductive lines CL1 and CL2, may be further provided on the third insulating layer 230.

In the case where a plurality of the stack structure ST are provided, the separation structure 150 may be provided in a second trench TR2, which is formed between the stack structures ST and is extended in the first direction D1. The separation structure 150 may be spaced apart from the first and second vertical channel structures VS1 and VS2 in the second direction D2. For example, a top surface of the separation structure 150 may be located at a level that is higher than top surfaces of the first and second vertical channel structures VS1 and VS2 in the cross-sectional views of FIGS. 6A and 6B. A bottom surface of the separation structure 150 may be substantially coplanar with the top surface of the first source conductive pattern SCP1 and may be located at a level higher than the top surface of the second substrate 100 in the cross-sectional views of FIGS. 6A and 6B.

In an embodiment, a plurality of the separation structures 150 may be provided, and in this case, the separation structures 150 may be spaced apart from each other in the second direction D2 with the stack structure ST interposed therebetween. The separation structure 150 may correspond to the separation structures 3230 of FIGS. 3 and 4.

A separation spacer 130 may be provided between the separation structure 150 and the stack structure ST to at least partially enclose the separation structure 150. The separation spacer 130 may be provided to be on and at least partially conformally cover side surfaces of the first and second interlayer dielectric layers ILDa and ILDb and the first and second gate electrodes ELa and ELb. The separation structure 150 may be formed of or include, for example, silicon oxide. The separation spacer 130 may be formed of or include a material having an etch selectivity with respect to the second source conductive pattern SCP2, the first and second semiconductor layers 121 and 123. The separation spacer 130 may be formed of or include, for example, silicon nitride.

Figure 7A:
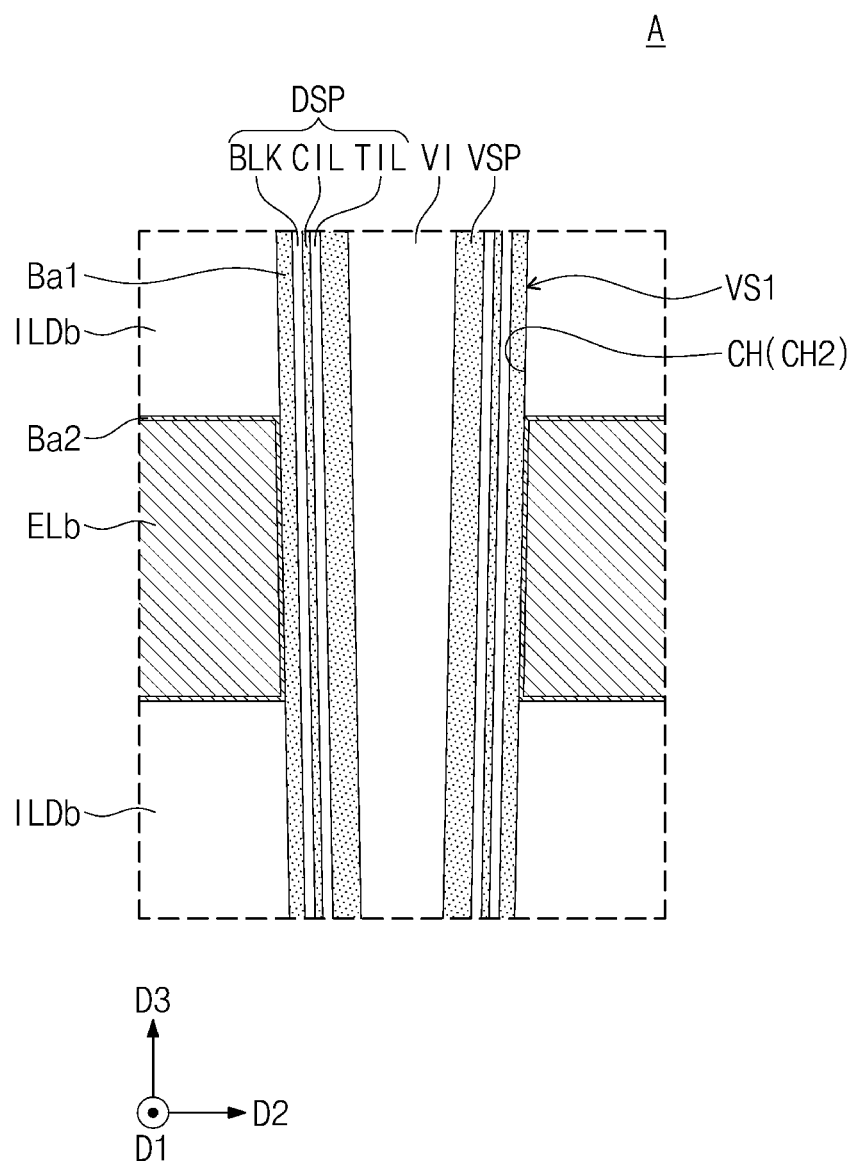
FIG. 7A is an enlarged sectional view illustrating a portion of a three-dimensional semiconductor memory device according to an embodiment of the inventive concept and corresponding to a portion 'A' of FIG. 6A.
Figure 7B:
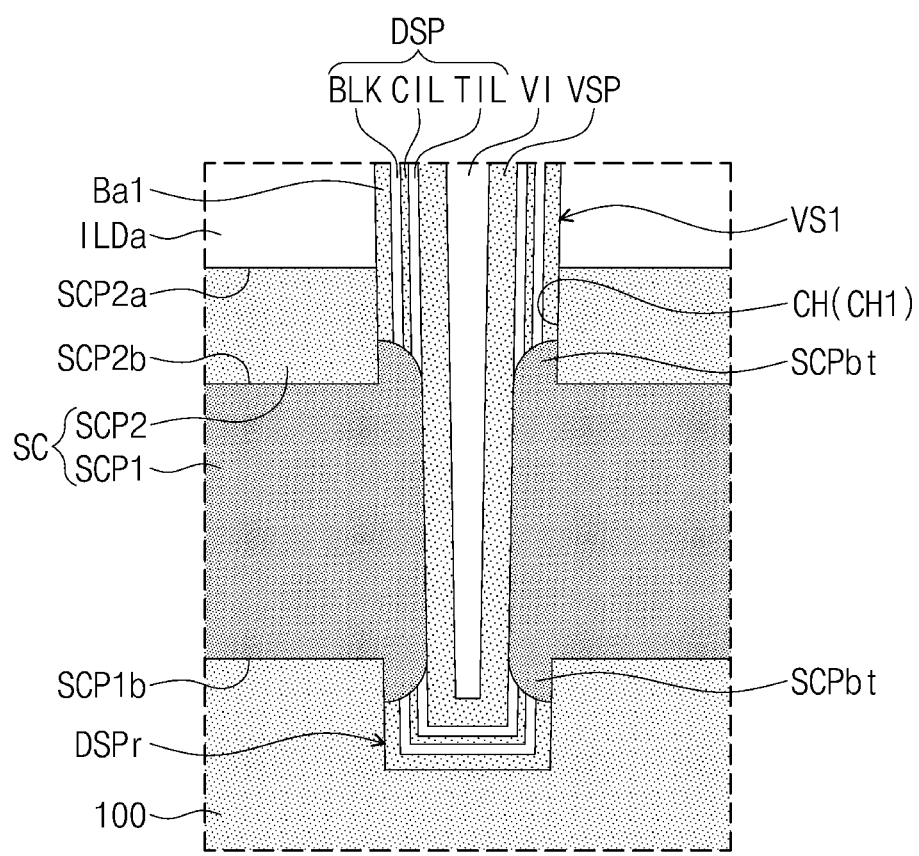
FIG. 7B is an enlarged sectional view illustrating a portion of a three-dimensional semiconductor memory device according to an embodiment of the inventive concept and corresponding to a portion 'B' of FIG. 6A.

FIG. 7A is an enlarged sectional view illustrating a portion of a three-dimensional semiconductor memory device according to an embodiment of the inventive concept and corresponding to a portion 'A' of FIG. 6A. FIG. 7B is an enlarged sectional view illustrating a portion of a three-dimensional semiconductor memory device according to an embodiment of the inventive concept and corresponding to a portion 'B' of FIG. 6A.

Each of FIGS. 7A and 7B illustrates the source structure SC, which includes the first and second source conductive patterns SCP1 and SCP2, or one of the first vertical channel structures VS1, which include the first barrier pattern Ba1, the data storage pattern DSP, the vertical semiconductor pattern VSP, the insulating gapfill pattern VI, and the lower data storage pattern DSPr. For convenience of description, one of the stack structure ST and one of the first vertical channel structures VS1 will be described with reference to FIGS. 6A, 7A, and 7B, but the remaining ones of the stack structures ST and the first vertical channel structures VS1 may have substantially the same features as those described with reference to FIGS. 6A, 7A, and 7B.

The data storage pattern DSP may include a blocking insulating layer BLK, a charge storing layer CIL, and a tunneling insulating layer TIL, which are sequentially stacked. The blocking insulating layer BLK may be adjacent to the stack structure ST or the source structure SC, and the tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK may be on and at least partially cover the inner side surface of the first barrier pattern Ba1. The blocking insulating layer BLK may be spaced apart from the first and second interlayer dielectric layers ILDa and ILDb and the first and second gate electrodes ELa and ELb with the first barrier pattern Ba1 interposed therebetween. The first barrier pattern Ba1 may be provided to be on and at least partially conformally cover an inner side surface of each of the vertical channel holes CH.

In an embodiment, the first barrier pattern Ba1 may be provided on the inner side surface of each of the vertical channel holes CH, not between each of the first and second interlayer dielectric layers ILDa and ILDb and each of the first and second gate electrodes ELa and ELb, and thus, it may be possible to reduce a total thickness of the stack structure ST and thereby to reduce a size of a three-dimensional semiconductor memory device.

The blocking insulating layer BLK, the charge storing layer CIL, and the tunneling insulating layer TIL may extend in the third direction D3 between the first barrier pattern Ba1 and the vertical semiconductor pattern VSP. In an embodiment, the Fowler-Nordheim (FN) tunneling phenomenon, which is caused by a voltage difference between the vertical semiconductor pattern VSP and the first and second gate electrodes ELa and ELb, may be used to store or change data in the data storage pattern DSP. For example, the blocking insulating layer BLK and the tunneling insulating layer TIL may be formed of or include silicon oxide, and the charge storing layer CIL may be formed of or include silicon nitride or silicon oxynitride.

The first source conductive pattern SCP1 of the source structure SC may be in physical contact with the vertical semiconductor pattern VSP, and the second source conductive pattern SCP2 may be spaced apart from the vertical semiconductor pattern VSP with the first barrier pattern Ba1 and the data storage pattern DSP interposed therebetween. The first source conductive pattern SCP1 may be spaced apart from the insulating gapfill pattern VI with the vertical semiconductor pattern VSP interposed therebetween.

More specifically, the first source conductive pattern SCP1 may include protruding portions SCP1*bt* which are located at a level higher than a bottom surface SCP2*b* of the second source conductive pattern SCP2 or lower than a bottom surface SCP1*b* of the first source conductive pattern SCP1 in the cross-sectional views of FIGS. 6A, 7A, and 7B. However, the protruding portions SCP1*bt* may be located at a level lower than a top surface SCP2*a* of the second source conductive pattern SCP2 in the cross-sectional views of FIGS. 6A, 7A, and 7B. A surface of the protruding portion SCP1*bt*, which is in physical contact with the data storage pattern DSP or the lower data storage pattern DSPr, may have a curved shape.

Referring to FIGS. 6A and 7, a second barrier pattern Ba2 may be provided between each of the first and second gate electrodes ELa and ELb and the first barrier pattern Ba1. The second barrier pattern Ba2 may extend from a region, which is located between each of the first and second gate electrodes ELa and ELb and the first barrier pattern Ba1, to regions, which are located on and under each of the first and second gate electrodes ELa and ELb. The second barrier pattern Ba2 may be formed of or include a material that is different from the first and second gate electrodes ELa and ELb and the first barrier pattern Ba1. The second barrier pattern Ba2 may be formed of or include at least one of, for example, tantalum, tantalum nitride, tantalum silicon nitride, titanium, titanium nitride, titanium silicon nitride, tungsten, and/or tungsten nitride.

Figure 8:
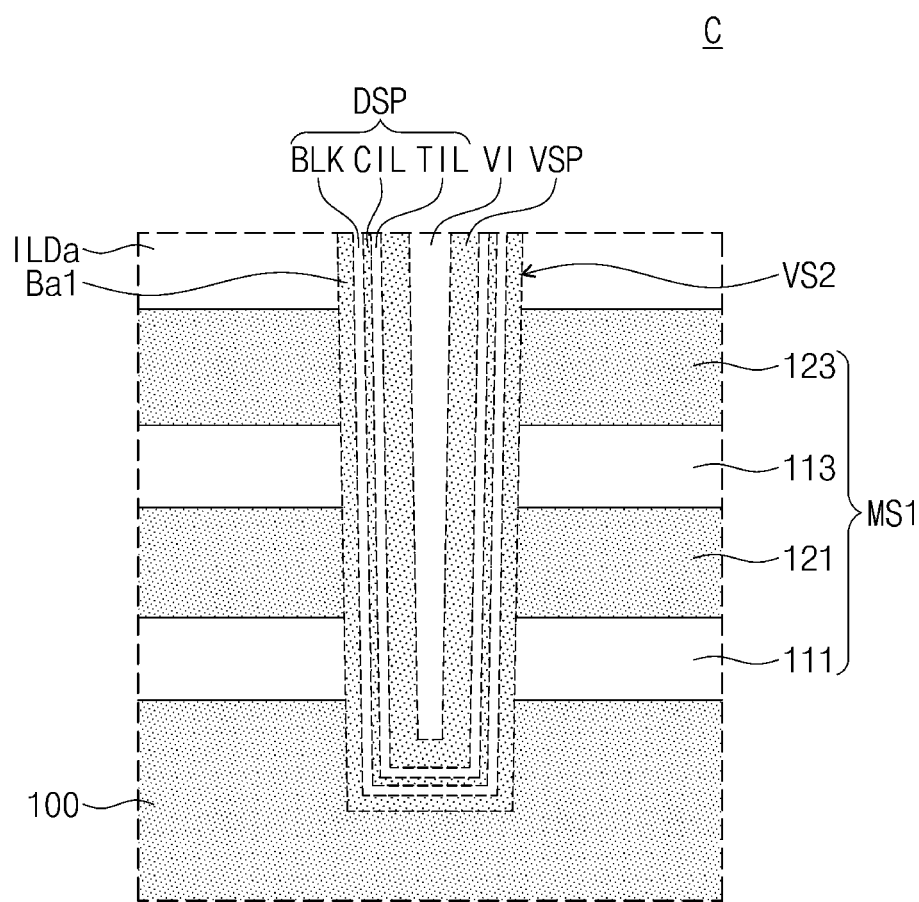
FIG. 8 is an enlarged view illustrating a portion of a three-dimensional semiconductor memory device according to an embodiment of the inventive concept and corresponding to a portion 'C' of FIG. 6B.

FIG. 8 is an enlarged view illustrating a portion of a three-dimensional semiconductor memory device according to an embodiment of the inventive concept and corresponding to a portion 'C' of FIG. 6B. In the following description, an element previously described with reference to FIGS. 7A and 7B may be identified by the same reference number without repeating an overlapping description thereof for concise description.

FIG. 8 illustrates one of the second vertical channel structures VS2 including the first barrier pattern Ba1, the data storage pattern DSP, the vertical semiconductor pattern VSP, and the insulating gapfill pattern VI, and the first mold structure MS1 including the first and second buffer insulating layers 111 and 113 and the first and second semiconductor layers 121 and 123.

The first and second buffer insulating layers 111 and 113 and the first and second semiconductor layers 121 and 123 may be spaced apart from the data storage pattern DSP with the first barrier pattern Ba1 interposed therebetween. In addition, the second substrate 100 may be spaced apart from the data storage pattern DSP with the first barrier pattern Ba1 interposed therebetween. In other words, the first and second buffer insulating layers 111 and 113, the first and second semiconductor layers 121 and 123, and the second substrate 100 may not be in contact with the data storage pattern DSP and the vertical semiconductor pattern VSP of each of the second vertical channel structures VS2.

FIGS. 9 to 17 are sectional views, which are taken along the line I-I' of FIG. 5, that illustrate a method of fabricating a three-dimensional semiconductor memory device, according to an embodiment of the inventive concept. Hereinafter, a method of fabricating a three-dimensional semiconductor memory device, according to an embodiment of the inventive concept, will be described in more detail with reference to FIGS. 5, 6A, 6B, and 9 to 17.

Figure 9:
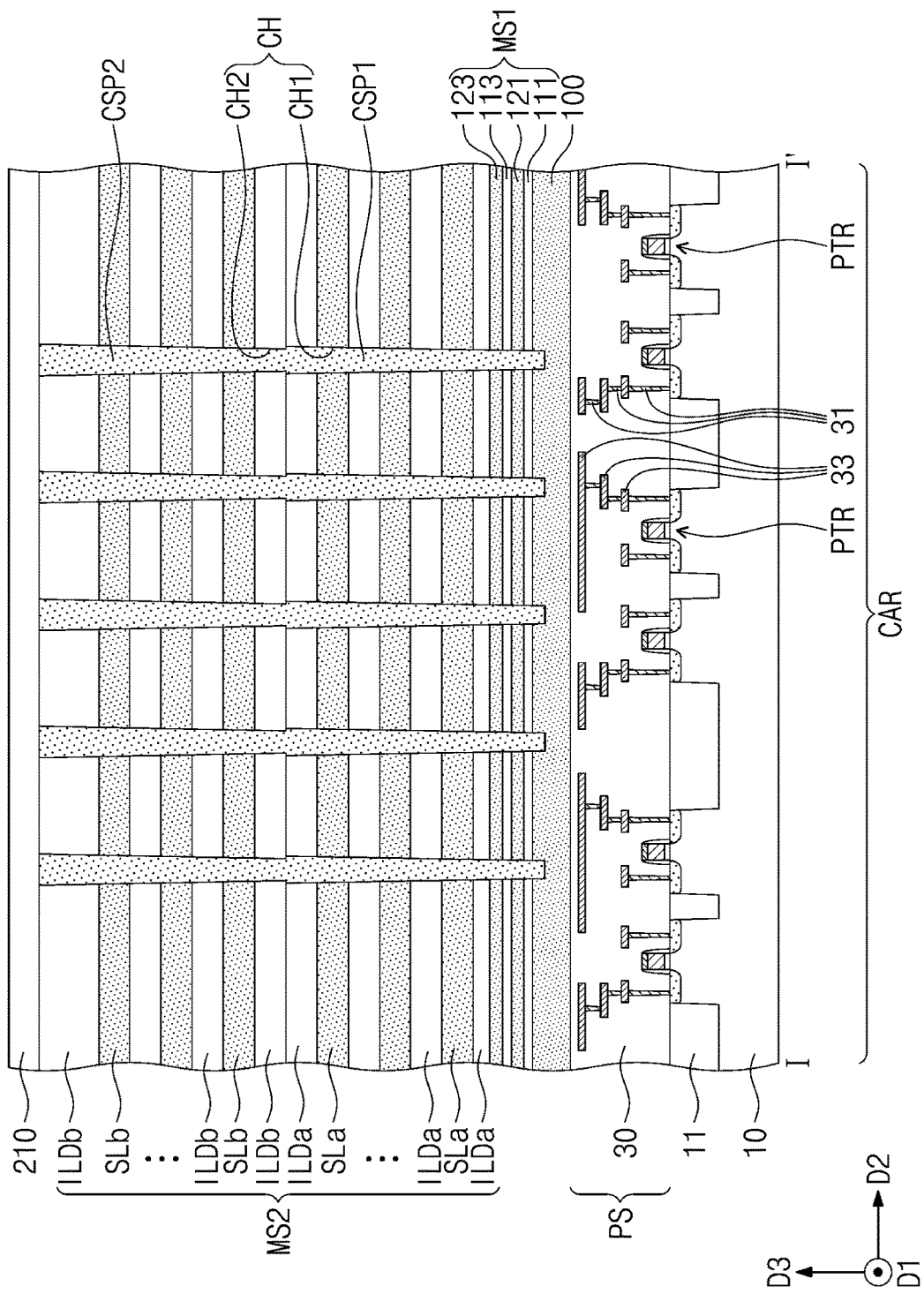
FIGS. 9 to 17 are sectional views, which are taken along the line I-I' of FIG. 5 that illustrate a method of fabricating a three-dimensional semiconductor memory device, according to an embodiment of the inventive concept.

Referring to FIGS. 5 and 9, the first substrate 10 including the cell array region CAR and the contact region CCR may be provided. The device isolation layer 11 may be formed in the first substrate 10 to define an active region. The formation of the device isolation layer 11 may include forming a trench in an upper portion of the first substrate 10 and at least partially filling the trench with a silicon oxide layer.

The peripheral circuit transistors PTR may be formed on the active region defined by the device isolation layer 11. The peripheral contact plugs 31 and the peripheral circuit interconnection lines 33 may be formed to be connected to the peripheral source/drain regions 29 of the peripheral circuit transistors PTR. The peripheral circuit insulating layer 30 may be formed to be on and at least partially cover the peripheral circuit transistors PTR, the peripheral contact plugs 31, and the peripheral circuit interconnection lines 33.

The second substrate 100 may be formed on the peripheral circuit insulating layer 30. The second substrate 100 may extend from the cell array region CAR toward the contact region CCR.

A portion of the second substrate 100 on the contact region CCR may be removed. The partial removal of the second substrate 100 may include forming a mask pattern to at least partially cover a portion of the contact region CCR and the cell array region CAR and etching the second substrate 100 using the mask pattern as an etching mask. The partial removal of the second substrate 100 may be performed to form a region, in which the peripheral contact plug TCP described above will be provided.

The first mold structure MS1 may be formed on the second substrate 100. The formation of the first mold structure MS1 may include sequentially stacking the first buffer insulating layer 111, the first semiconductor layer 121, the second buffer insulating layer 113, and the second semiconductor layer 123 on the second substrate 100. The first and second buffer insulating layers 111 and 113 may be formed of or include, for example, silicon oxide. The first and second semiconductor layers 121 and 123 may be formed of or include a material having an etch selectivity with respect to the first barrier pattern Ba1 to be described below. The first and second semiconductor layers 121 and 123 may be formed of or include a semiconductor material (e.g., silicon).

A second mold structure MS2 may be formed on the first mold structure MS1. The formation of the second mold structure MS2 may include alternately and repeatedly stacking the first interlayer dielectric layers ILDa and first sacrificial layers SLa on the second substrate 100, forming the first vertical channel holes CH1 to penetrate the first interlayer dielectric layers ILDa and the first sacrificial layers SLa, forming a first channel sacrificial pattern CSP1 to at least partially fill each of the first vertical channel holes CH1, alternately and repeatedly stacking the second interlayer dielectric layers ILDb and second sacrificial layers SLb on the uppermost one of the first interlayer dielectric layers ILDa, forming the second vertical channel holes CH2 to penetrate the second interlayer dielectric layers ILDb and the second sacrificial layers SLb and to be respectively connected to the first vertical channel holes CH1, and forming a second channel sacrificial pattern CSP2 to at least partially fill each of the second vertical channel holes CH2 and to be connected to the first channel sacrificial pattern CSP1. The first vertical channel holes CH1 may penetrate not only the first interlayer dielectric layers ILDa and the first sacrificial layers Sla, but also the first mold structure MS1 and, in an embodiment, may further penetrate at least a portion of the second substrate 100.

Before the formation of the first and second vertical channel holes CH1 and CH2, a trimming process may be performed on the second mold structure MS2 on the contact region CCR. The trimming process may include forming a mask pattern to at least partially cover a portion of the top surface of the second mold structure MS2 on the cell array region CAR and the contact region CCR, patterning the second mold structure MS2 using the mask pattern as a patterning mask, reducing an area of the mask pattern, and patterning the second mold structure MS2 using the mask pattern having the reduced area as a patterning mask. In an embodiment, the operations of reducing the area of the mask pattern and patterning the second mold structure MS2 using the mask pattern may be repeated several times during the trimming process. As a result of the trimming process, the second mold structure MS2 may have a stepwise structure.

The first and second sacrificial layers SLa and SLb may be formed of or include an insulating material that is different from the first and second interlayer dielectric layers ILDa and ILDb. The first and second sacrificial layers SLa and SLb may be formed of or include a material having an etch selectivity with respect to the first and second interlayer dielectric layers ILDa and ILDb. For example, the first and second sacrificial layers SLa and SLb may be formed of silicon nitride, and the first and second interlayer dielectric layers ILDa and ILDb may be formed of silicon oxide. The first and second sacrificial layers SLa and SLb may have substantially the same thickness, and the first and second interlayer dielectric layers ILDa and ILDb may have at least two different thicknesses that are determined depending on their vertical positions relative to the first substrate 10 being a base reference plane.

A first insulating pattern 210 may be formed on the second mold structure MS2. The first insulating pattern 210 may be formed to be on and at least partially cover the top surface of the second mold structure MS2 (i.e., the top surface of the uppermost one of the second interlayer dielectric layers ILDb) and the top surface of the second channel sacrificial pattern CSP2.

Figure 10:
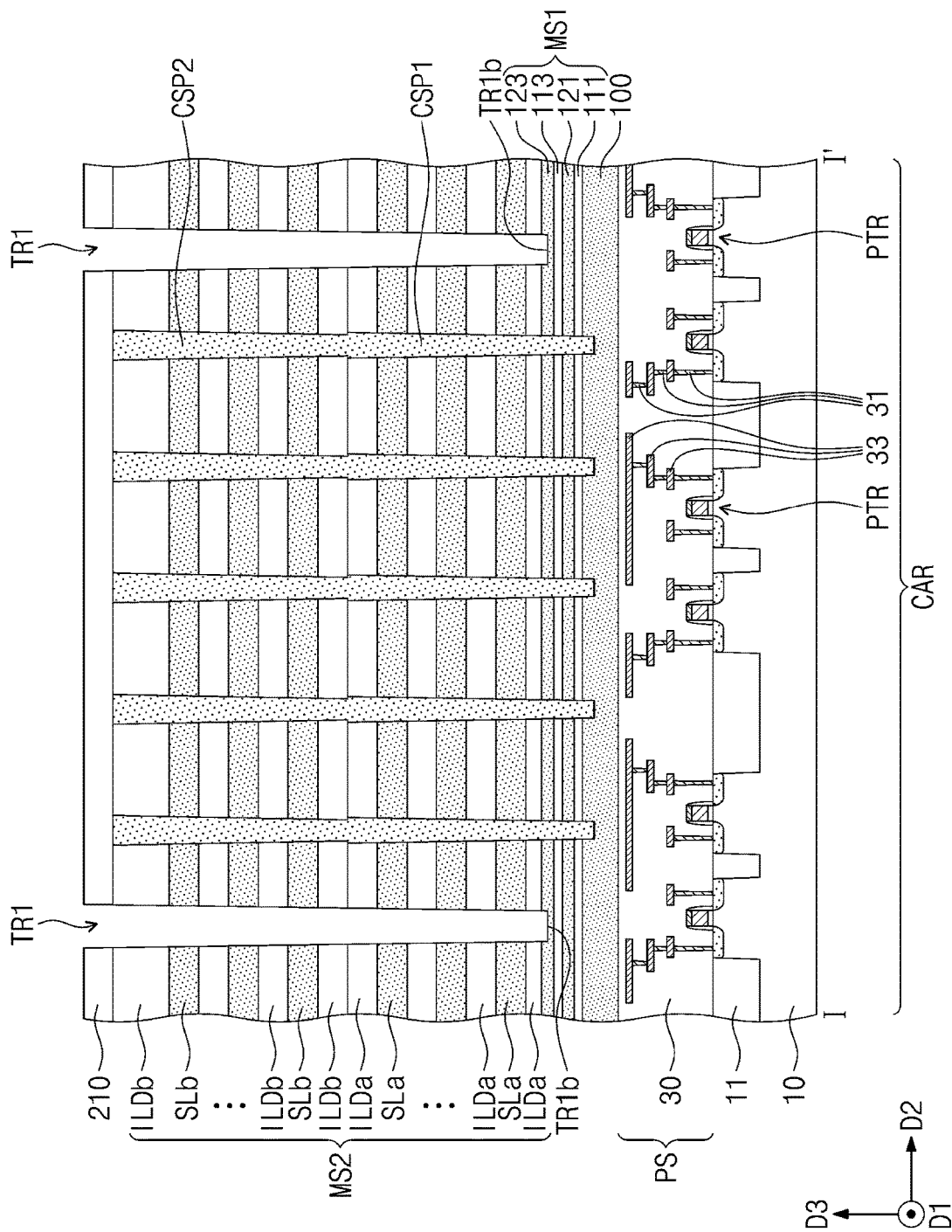

Referring to FIGS. 5 and 10, a first trench TR1 may be formed to penetrate the first insulating pattern 210 and the second mold structure MS2. In an embodiment, the first trench TR1 may be formed to further penetrate at least a portion of the first mold structure MS1 (more specifically, at least a portion of the second semiconductor layer 123). For example, a bottom surface TR1b of the first trench TR1 may be located at a level lower than a bottom surface of the second mold structure MS2 (i.e., a bottom surface of the lowermost one of the first interlayer dielectric layers ILDa) and a top surface of the first mold structure MS1 relative to the first substrate 10 being a base reference plane. The first trench TR1 may be formed to expose side surfaces of the first and second interlayer dielectric layers ILDa and ILDb and side surfaces of the first and second sacrificial layers SLa and SLb. The first trench TR1 may extend from the cell array region CAR toward the contact region CCR.

Figure 11:
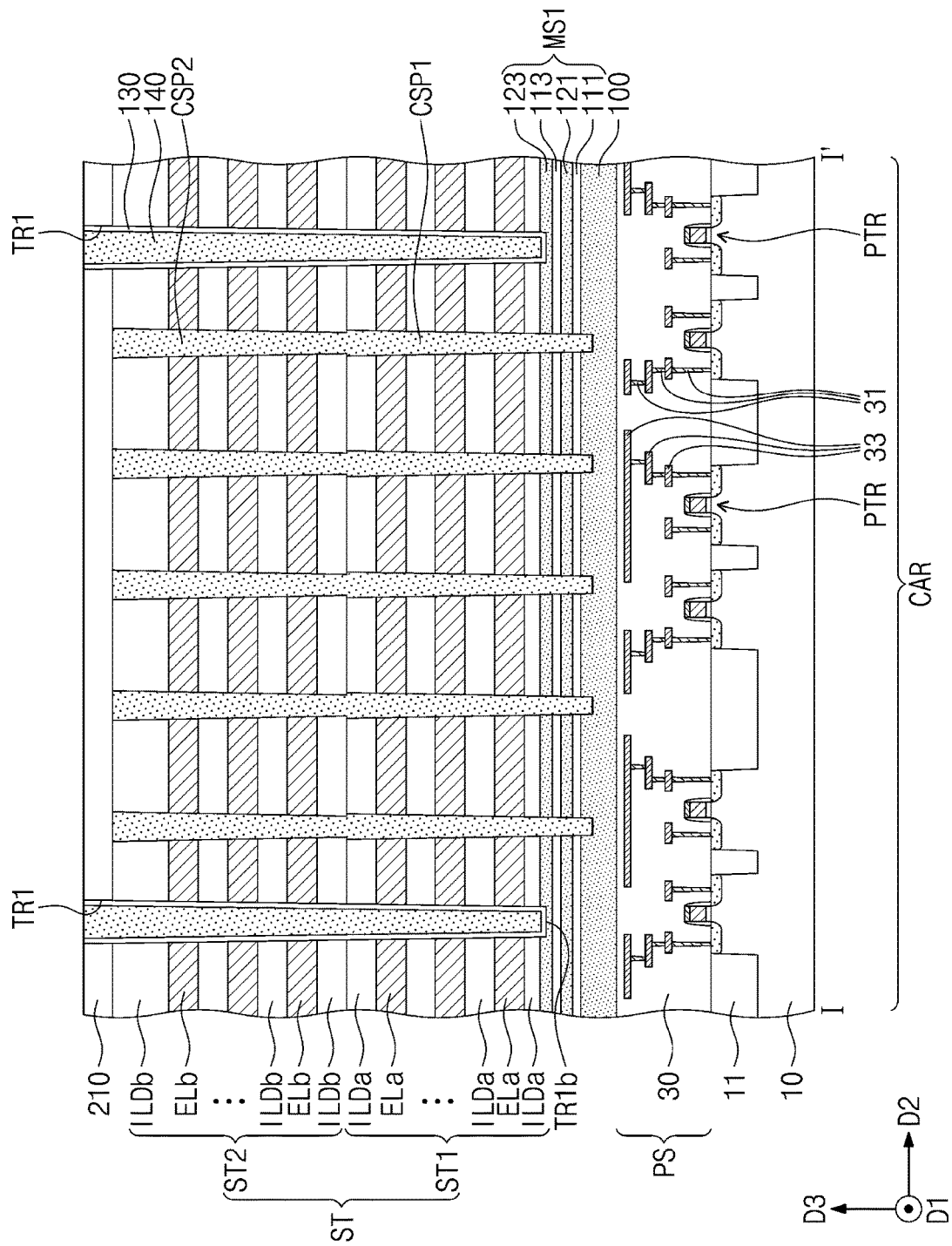

Referring to FIG. 11, the first and second sacrificial layers SLa and SLb exposed through the first trench TR1 may be selectively removed. The selective removal of the first and second sacrificial layers SLa and SLb may be performed through a wet etching process using an etching solution. The first and second gate electrodes ELa and ELb may be formed to at least partially fill empty spaces, which are formed by removing the first and second sacrificial layers SLa and SLb. As a result, the stack structure ST including the first and second gate electrodes ELa and ELb and the first and second interlayer dielectric layers ILDa and ILDb may be formed.

The formation of the first and second gate electrodes ELa and ELb may include forming the second barrier pattern Ba2 described with reference to FIG. 7A. The second barrier pattern Ba2 may be formed to at least partially conformally cover top and bottom surfaces of the first and second interlayer dielectric layers ILDa and ILDb and side surfaces of the first and second channel sacrificial patterns CSP1 and CSP2 and to at least partially fill the empty spaces, which are formed by removing the first and second sacrificial layers SLa and SLb.

The first and second gate electrodes ELa and ELb may be formed before the first and second vertical channel structures VS1 and VS2 to be described below, and this may make it possible to reduce the likelihood of or prevent the first and second vertical channel structures VS1 and VS2 from being partially etched when the first and second sacrificial layers SLa and SLb are removed. Accordingly, it may be possible to improve reliability and electrical characteristics of the three-dimensional semiconductor memory device according to an embodiment of the inventive concept.

A separation spacer 130 and a sacrificial separation pattern 140 may be formed to at least partially fill the first trench TR1. The separation spacer 130 and the sacrificial separation pattern 140 may extend from the cell array region CAR toward the contact region CCR.

Figure 12:
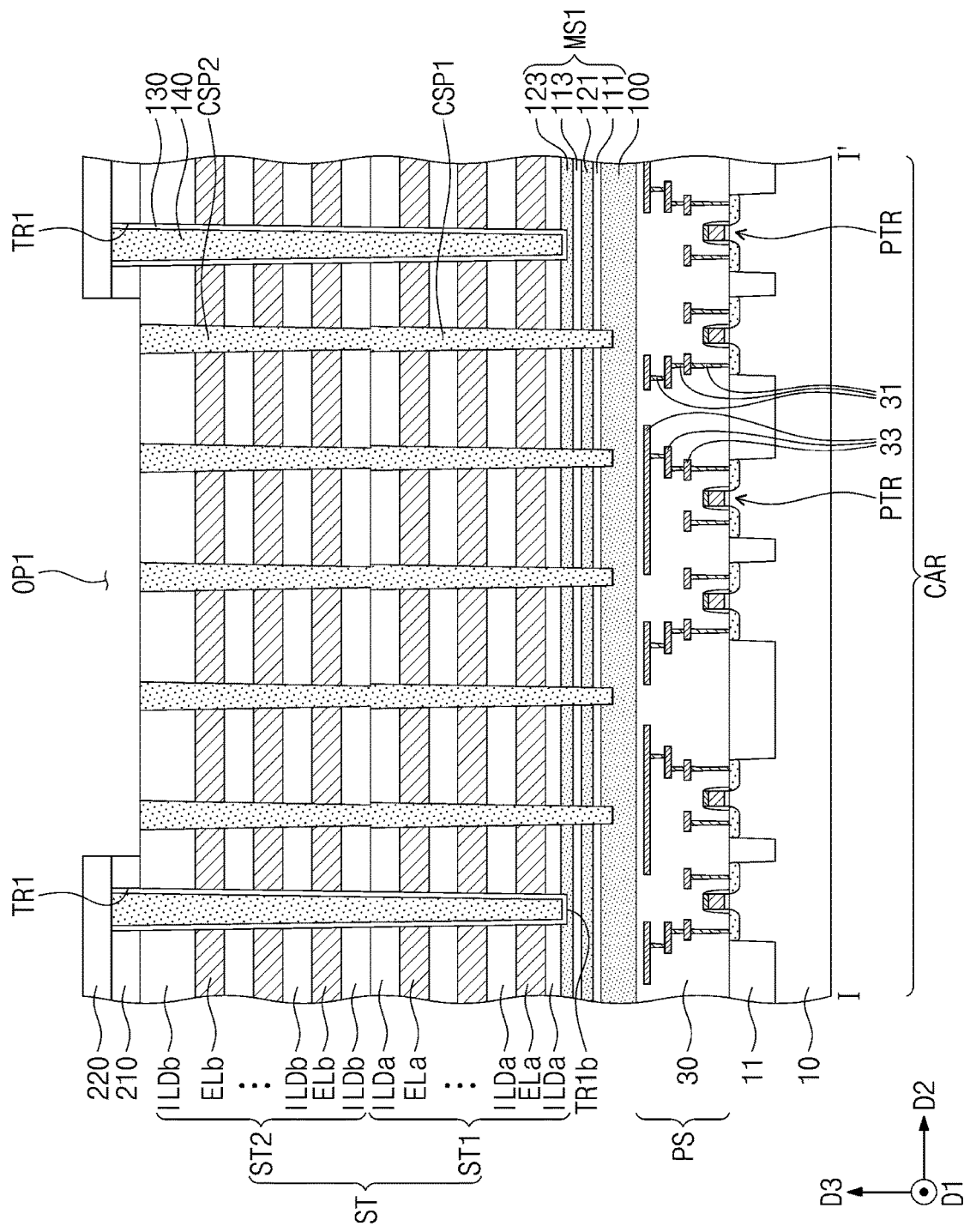

Referring to FIG. 12, a second insulating pattern 220 may be formed to at least partially cover a portion of a top surface of the first insulating pattern 210. An etching process may be performed using the second insulating pattern 220 as a mask. As a result of the etching process, a first opening OP1 may be formed. The first opening OP1 may be formed to expose a portion of the top surface of the stack structure ST and the top surface of the second channel sacrificial pattern CSP2. The first opening OP1 may not expose the separation spacer 130 and the sacrificial separation pattern 140. In other words, the first and second insulating patterns 210 and 220 may be formed to at least partially cover the separation spacer 130 and the sacrificial separation pattern 140.

Figure 13:
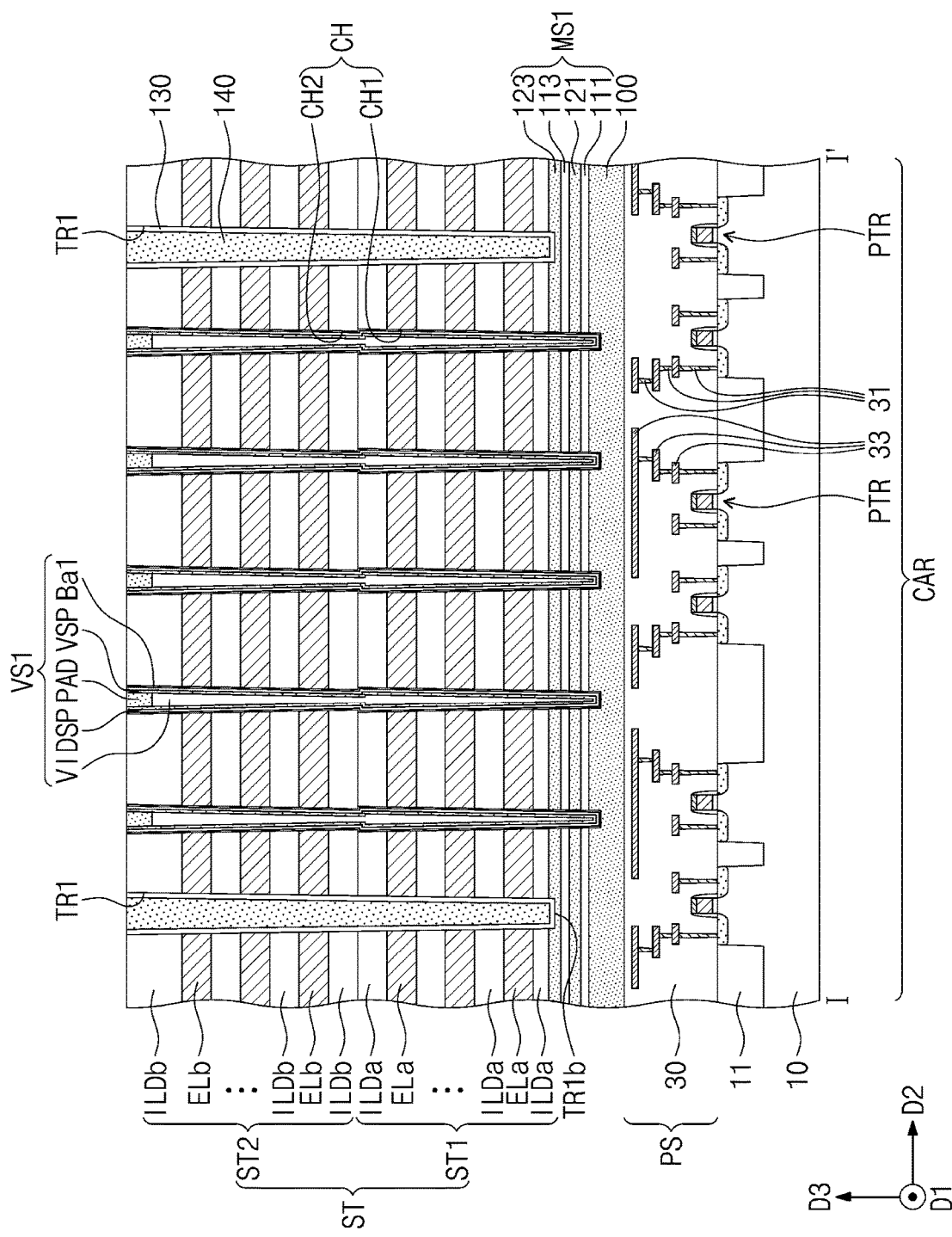

Referring to FIGS. 12 and 13, the second and first channel sacrificial patterns CSP2 and CSP1 exposed through the first opening OP1 may be removed. The first vertical channel structures VS1 may be formed on the cell array region CAR to at least partially fill empty spaces (i.e., the vertical channel holes CH), which are formed by the removing of the first and second channel sacrificial patterns CSP1 and CSP2. Similarly, the second vertical channel structures VS2 may be formed on the contact region CCR to at least partially fill the vertical channel holes CH.

The formation of each of the first and second vertical channel structures VS1 and VS2 may include forming the first barrier pattern Ba1 to at least partially conformally cover an inner side surface of each of the vertical channel holes CH, forming the data storage pattern DSP to at least partially conformally cover an inner side surface of the first barrier pattern Ba1, forming the vertical semiconductor pattern VSP to at least partially conformally cover a side surface of the data storage pattern DSP, forming the insulating gapfill pattern VI to at least partially fill at least a portion of a space enclosed by the vertical semiconductor pattern VSP, and forming the conductive pad PAD to at least partially fill a space enclosed by the vertical semiconductor pattern VSP and the insulating gapfill pattern VI.

After the formation of the first and second vertical channel structures VS1 and VS2, the first and second insulating patterns 210 and 220 may be removed, and in this case, the top surface of the stack structure ST may be exposed to the outside. Furthermore, the separation spacer 130 and the sacrificial separation pattern 140 may also be partially etched during the removing of the first insulating pattern 210.

Figure 14:
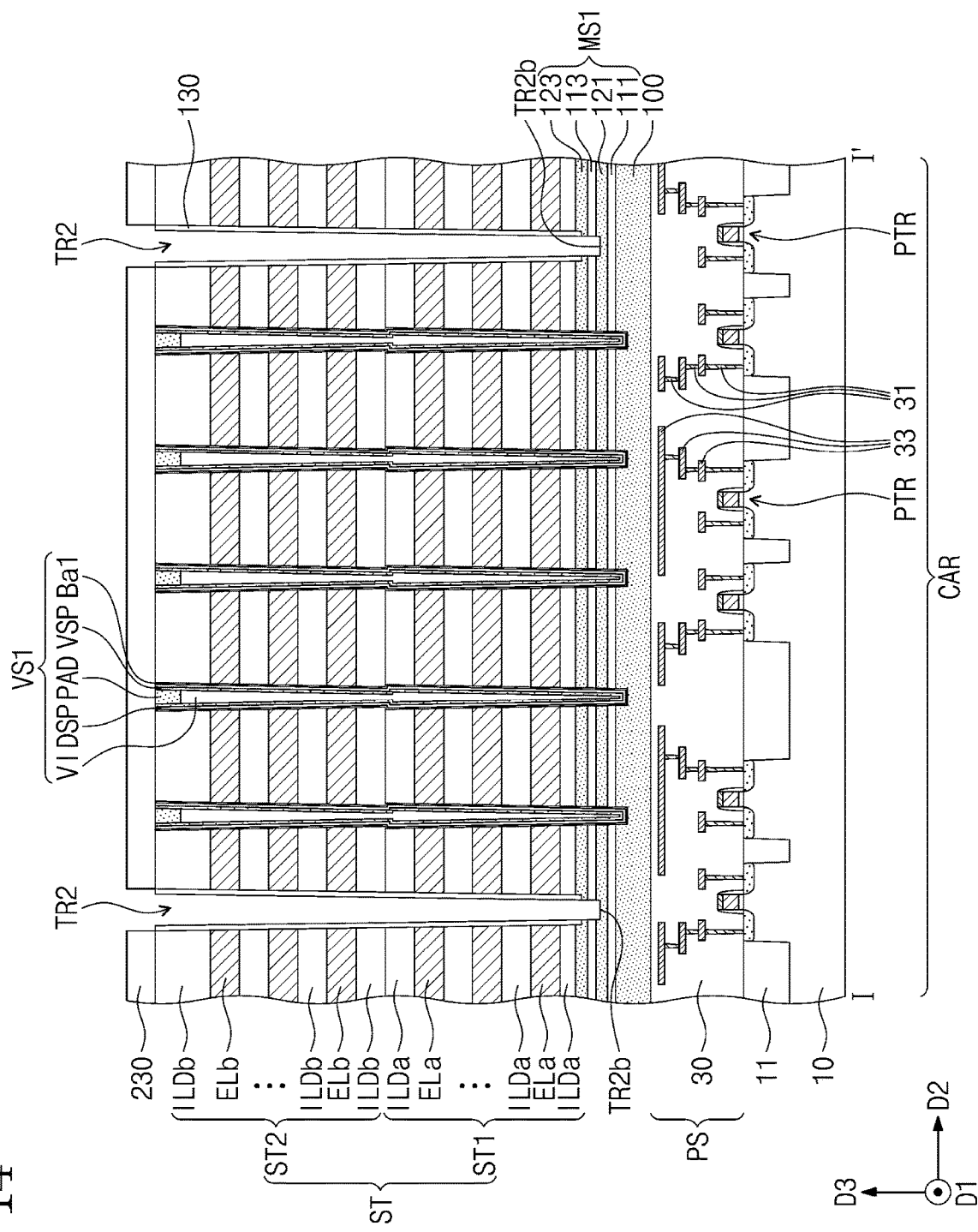

Referring to FIGS. 5 and 14, a third insulating pattern 230 may be formed on the top surface of the stack structure ST. The third insulating pattern 230 may correspond to the third insulating layer 230 described with reference to FIGS. 6A and 6B.

The third insulating pattern 230 may be formed to expose a top surface of the sacrificial separation pattern 140 to the outside. The second trench TR2 may be formed by selectively removing the sacrificial separation pattern 140 exposed by the third insulating pattern 230. In an embodiment, at least a portion of the first mold structure MS1 on the cell array region CAR may be removed during the process of removing the sacrificial separation pattern 140. However, the first mold structure MS1 on the contact region CCR may not be removed.

The second trench TR2 may extend from the cell array region CAR toward the contact region CCR. On the cell array region CAR, a bottom surface TR2b of the second trench TR2 may be located between a top surface of the first semiconductor layer 121 and the top surface of the second substrate 100.

Figure 15:
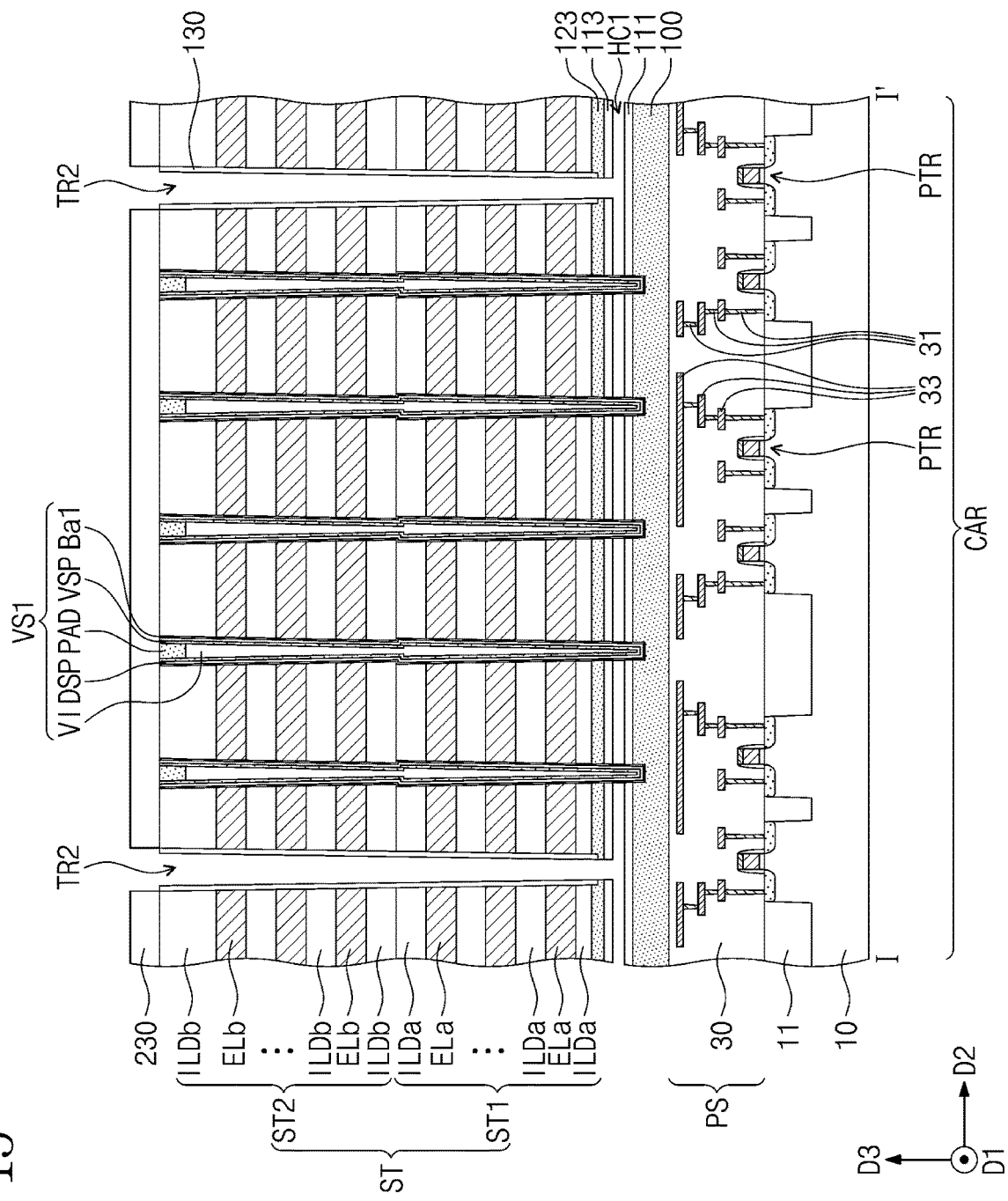

Referring to FIG. 15, the first semiconductor layer 121 exposed through the second trench TR2 may be selectively removed. The selective removal of the first semiconductor layer 121 may be performed through a wet etching process using etching solution. As a result of the removal of the first semiconductor layer 121, a first horizontal cavity HC1 may be formed between a top surface of the first buffer insulating layer 111 and a bottom surface of the second buffer insulating layer 113. The first horizontal cavity HC1 may mean an empty space between the first and second buffer insulating layers 111 and 113. A portion of the first barrier pattern Ba1 of each of the first vertical channel structures VS1 may be exposed through the first horizontal cavity HC1.

Because the first semiconductor layer 121 has an etch selectivity with respect to the first barrier pattern Ba1, it may be possible to prevent or suppress the first barrier pattern Ba1 and the data storage pattern DSP, which is enclosed by the first barrier pattern Ba1, from being damaged in a process of forming the first horizontal cavity HC1.

The removal of the first semiconductor layer 121 may be performed on the cell array region CAR, and the first mold structure MS1 on the contact region CCR (especially, a portion of the first semiconductor layer 121 provided on the contact region CCR) may remain as it is.

Figure 16:
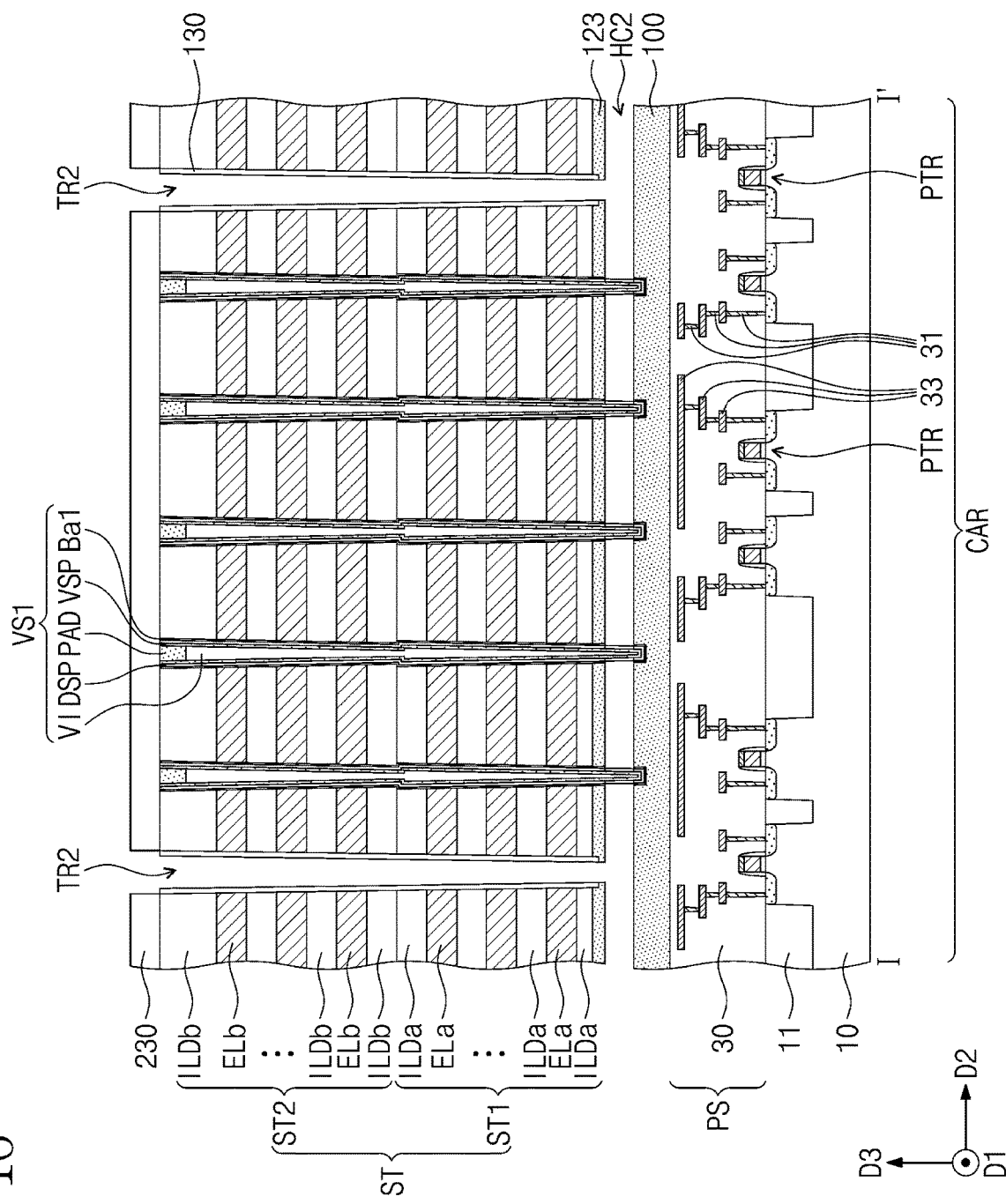

Referring to FIGS. 15 and 16, the first and second buffer insulating layers 111 and 113 exposed through the first horizontal cavity HC1 may be removed to form a second horizontal cavity HC2. Here, the second horizontal cavity HC2 may mean an empty space between the second substrate 100 and the second semiconductor layer 123. In addition, a portion of the first barrier pattern Ba1 and a portion of the data storage pattern DSP may be removed through the second horizontal cavity HC2. Accordingly, a portion of the vertical semiconductor pattern VSP of each of the first vertical channel structures VS1 may be exposed by the second horizontal cavity HC2.

The removal of the first and second buffer insulating layers 111 and 113 may be performed on the cell array region CAR, and the first mold structure MS1 on the contact region CCR (especially, a portion of each of the first and second buffer insulating layers 111 and 113 provided on the contact region CCR) may remain as it is.

Figure 17:
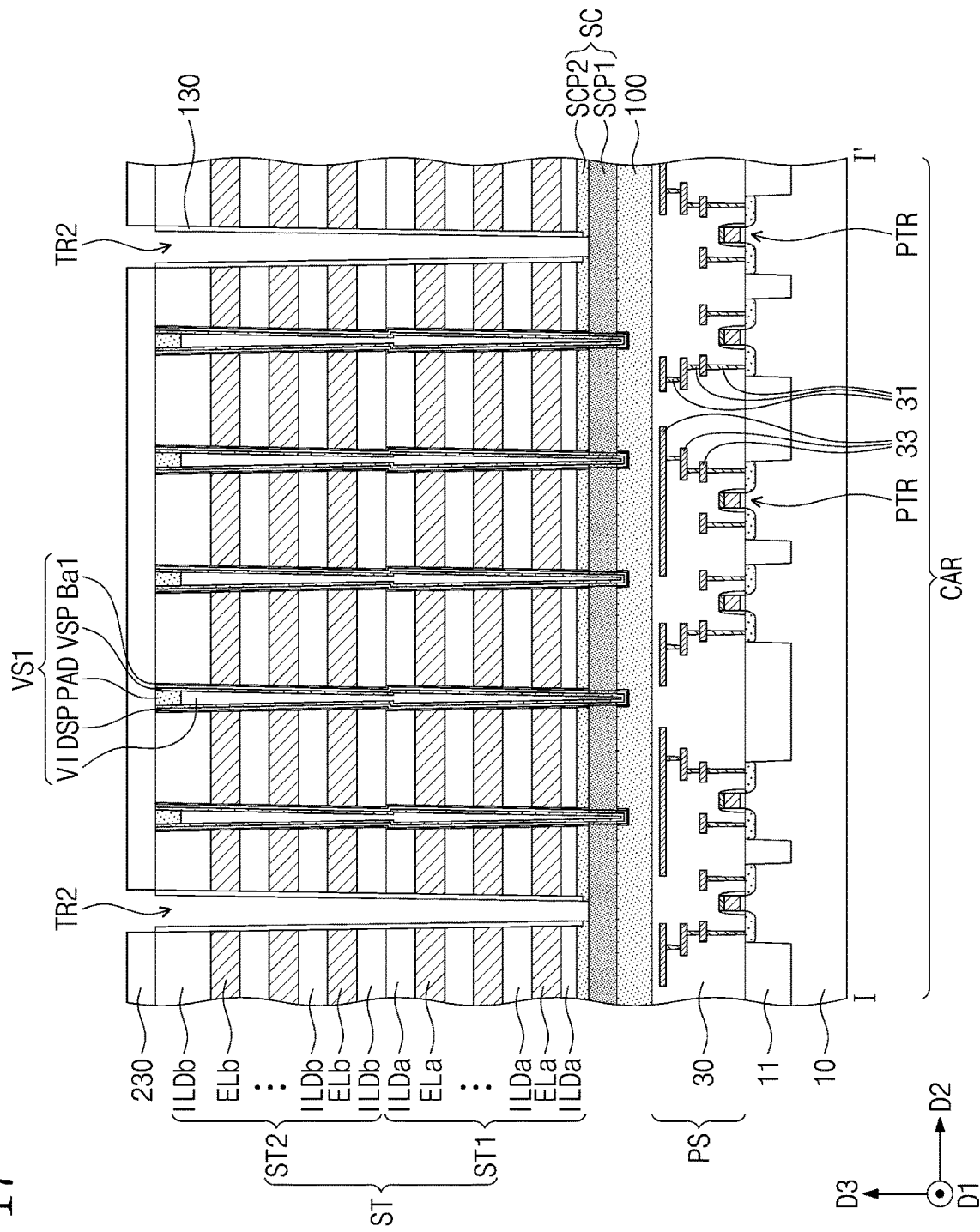

Referring to FIGS. 16 and 17, the first source conductive pattern SCP1 may be formed to at least partially fill the second horizontal cavity HC2. Although not shown, an air gap may be formed in the first source conductive pattern SCP1. The second semiconductor layer 123 on the cell array region CAR may be referred to as the second source conductive pattern SCP2, and as a result, the source structure SC including the first and second source conductive patterns SCP1 and SCP2 may be formed.

Referring back to FIGS. 5, 6A, and 6B, the separation structure 150 may be formed to at least partially fill the second trench TR2. The top surface of the separation structure 150 may be substantially coplanar with a top surface of the third insulating layer 230.

Thereafter, the bit line contact plugs BLCP may be formed to penetrate the third insulating layer 230, the cell contact plugs CCP may be formed to penetrate the third insulating layer 230 and the second insulating layer 170, and the peripheral contact plug TCP may be formed to penetrate the third insulating layer 230, the second insulating layer 170, and at least a portion of the first insulating layer 30. The bit lines BL connected to the bit line contact plugs BLCP, the first conductive lines CL1 connected to the cell contact plugs CCP, and the second conductive line CL2 connected to the peripheral contact plug TCP may be formed on the third insulating layer 230.

Figure 18:
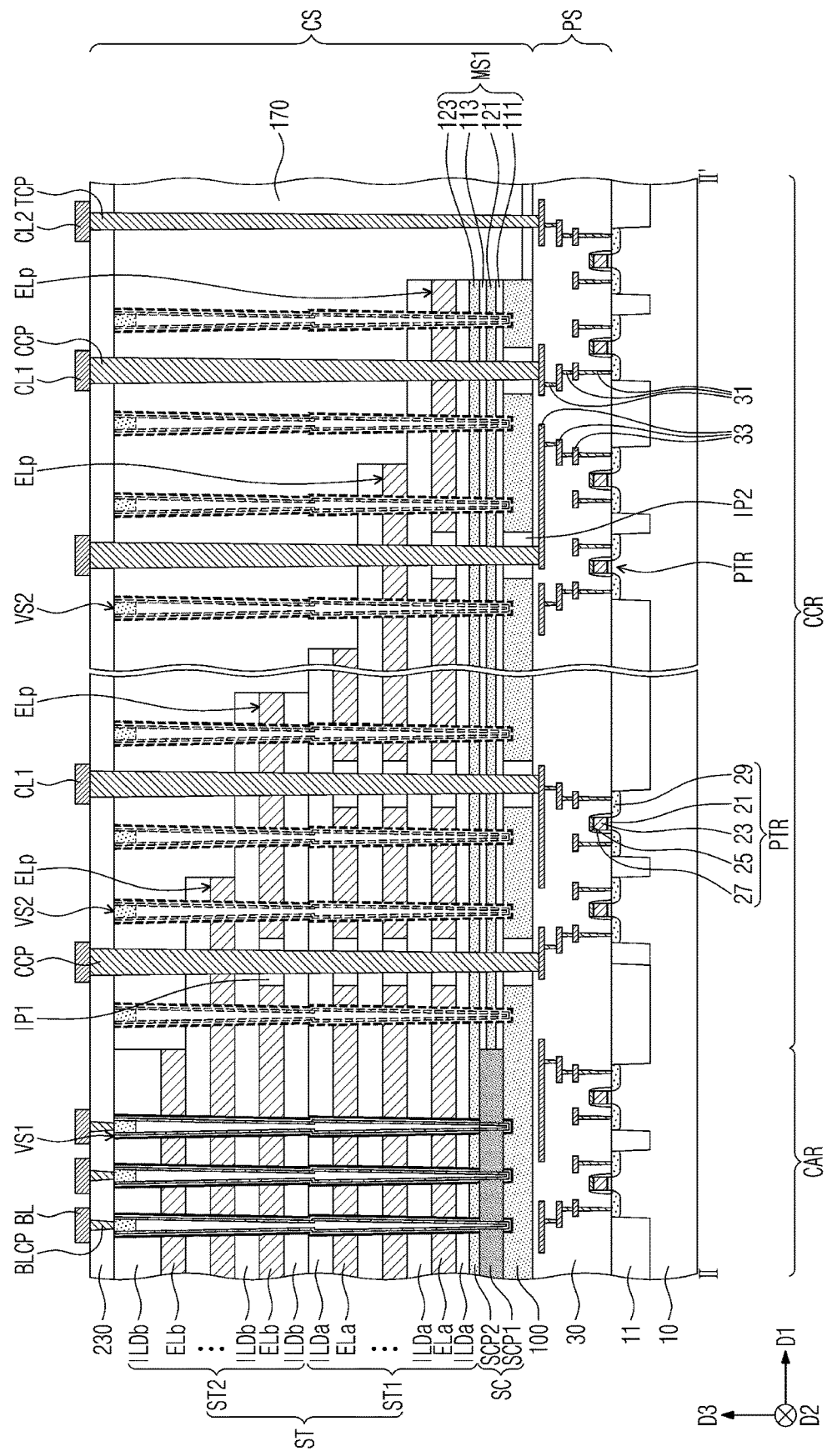
FIG. 18 is a sectional view, which is taken along the line II-II' of FIG. 5 that illustrates a three-dimensional semiconductor memory device according to an embodiment of the inventive concept.

FIG. 18 is a sectional view, which is taken along the line II-II' of FIG. 5, that illustrates a three-dimensional semiconductor memory device according to an embodiment of the inventive concept. In the following description, an element previously described with reference to FIGS. 5, 6A, and 6B may be identified by the same reference number without repeating an overlapping description thereof for concise description.

Referring to FIGS. 5 and 18, each of the cell contact plugs CCP may be provided to penetrate the third insulating layer 230, the second insulating layer 170, the stack structure ST, the first mold structure MS1, and the second substrate 100 and may be electrically connected to the peripheral circuit transistors PTR of the peripheral circuit structure PS. The cell contact plugs CCP may have bottom surfaces that are located at a level lower than a bottom surface of the stack structure ST relative to the first substrate 10 being a base reference plane. Each of the cell contact plugs CCP may be in contact with and electrically connected to a corresponding one of the gate electrodes ELa and ELb. In an embodiment, each of the cell contact plugs CCP may be in contact with the pad portion ELp of the uppermost one of the gate electrodes ELa and ELb provided in the stepwise shape.

Each of the cell contact plugs CCP may be spaced apart from the gate electrodes ELa and ELb, which are located below the pad portions ELp, in a horizontal direction (e.g., in all directions parallel to a plane defined by the first and second directions D1 and D2) with a first insulating pattern IP1 interposed therebetween and may be electrically disconnected from the gate electrodes ELa and ELb below the pad portions ELp. Each of the cell contact plugs CCP may be separated from the second substrate 100 in a horizontal direction with a second insulating pattern IP2 interposed therebetween and may be electrically disconnected from the second substrate 100. The first and second insulating patterns IP1 and IP2 may be formed of or include the same material as the interlayer dielectric layers ILDa and ILDb of the stack structure ST. A bottom surface of each of the cell contact plugs CCP may be located at a level lower than a bottom surface of the second substrate 100 relative to the first substrate 10 being a base reference plane. A height of each of the cell contact plugs CCP in the third direction D3 may be substantially equal to a height of the peripheral contact plug TCP in the third direction D3.

The formation of the cell and peripheral contact plugs CCP and TCP may include forming vertical holes to penetrate the third insulating layer 230, the second insulating layer 170, the stack structure ST, and the second substrate 100 and at least partially filling the vertical holes with a conductive material. The vertical holes, in which the cell and peripheral contact plugs CCP and TCP are provided, may be formed by the afore-described etching process for forming the vertical channel holes CH, and in this case, it may be possible to reduce an iteration number of a high-aspect-ratio etching process and a process difficulty in a fabrication process.

Figure 19:
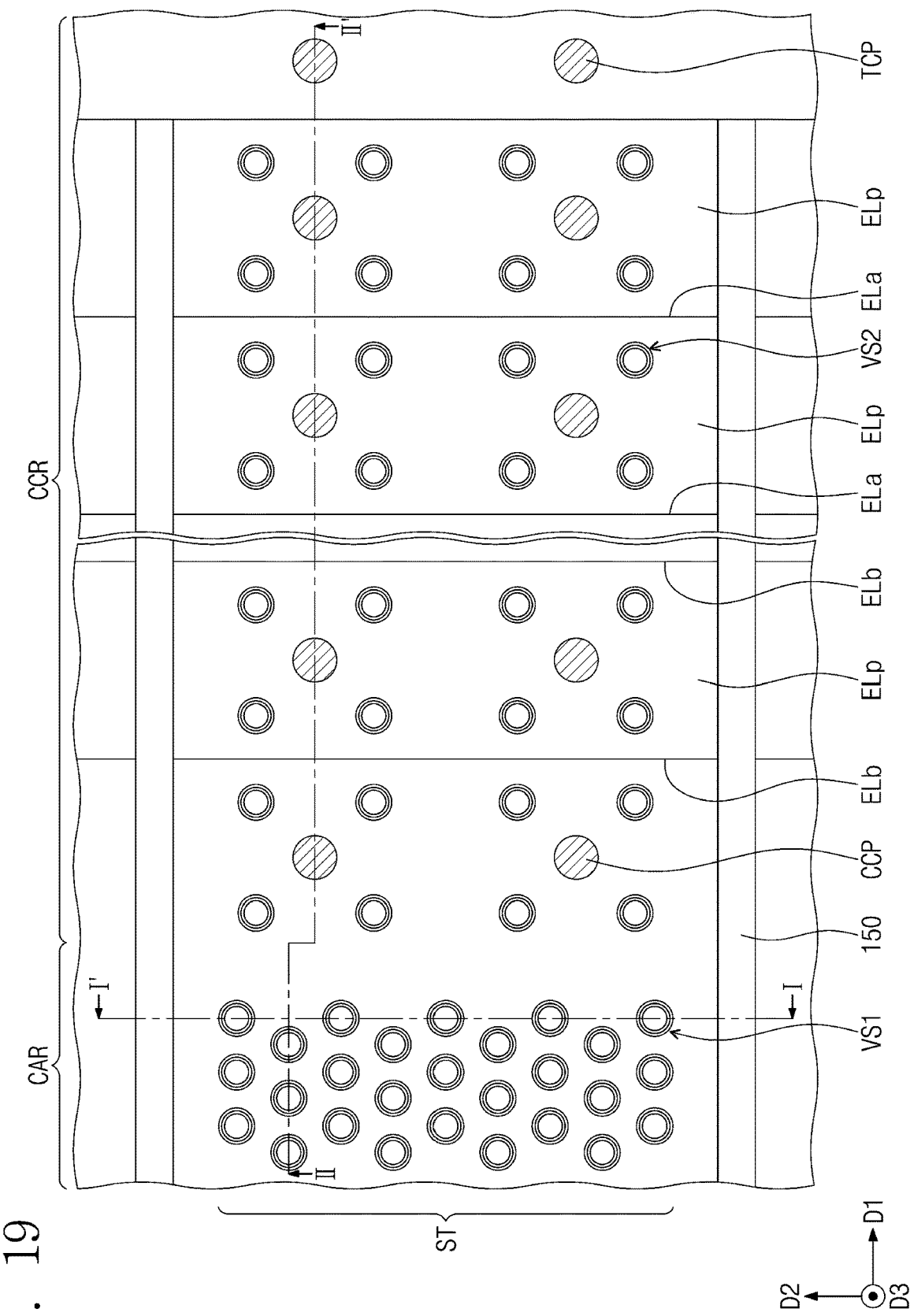
FIG. 19 is a plan view illustrating a three-dimensional semiconductor memory device according to an embodiment of the inventive concept.
Figure 20A:
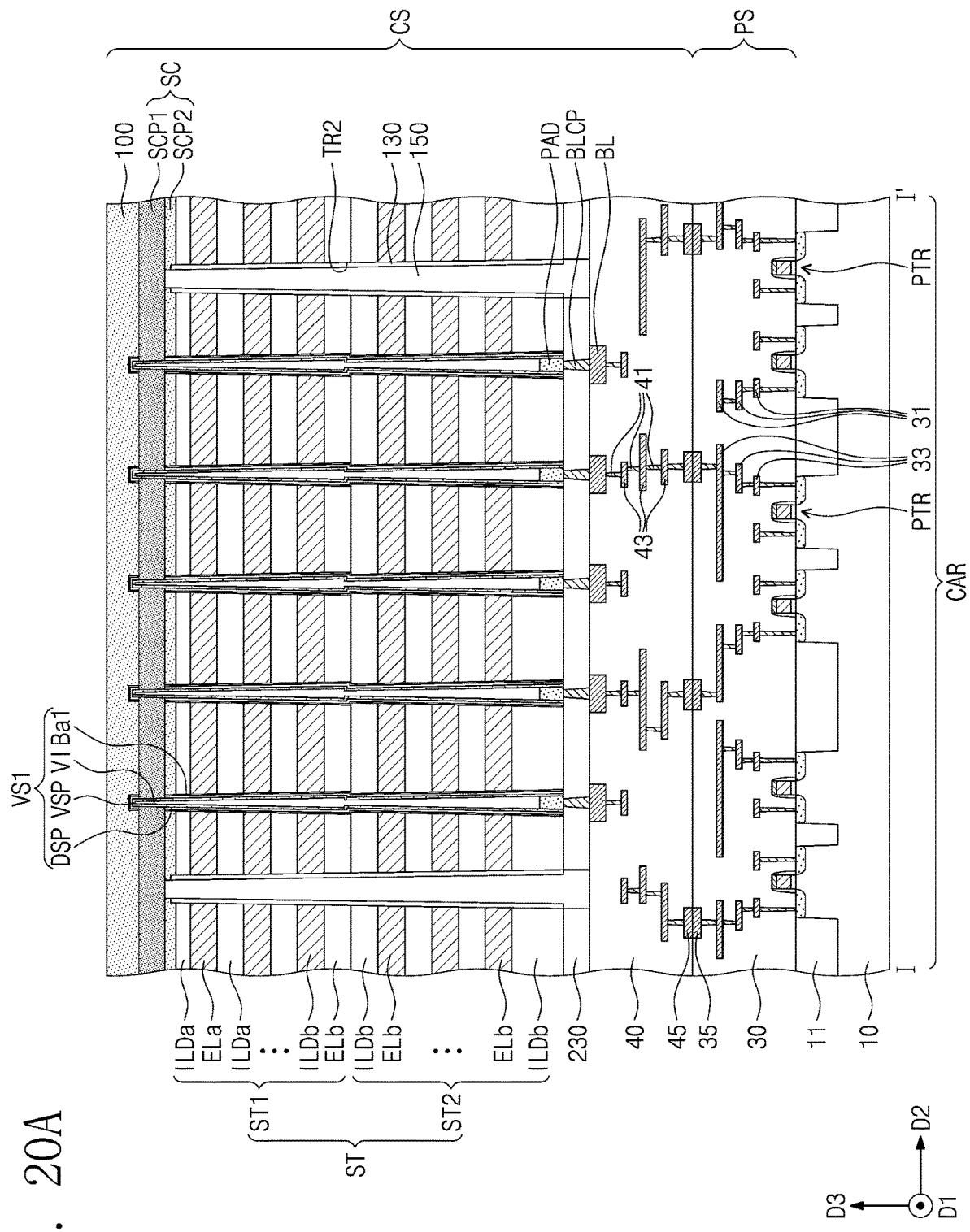
FIGS. 20A and 20B are sectional views, which are respectively taken along lines I-I' and II-II' of FIG. 19 that illustrate a three-dimensional semiconductor memory device according to an embodiment of the inventive concept.
Figure 20B:
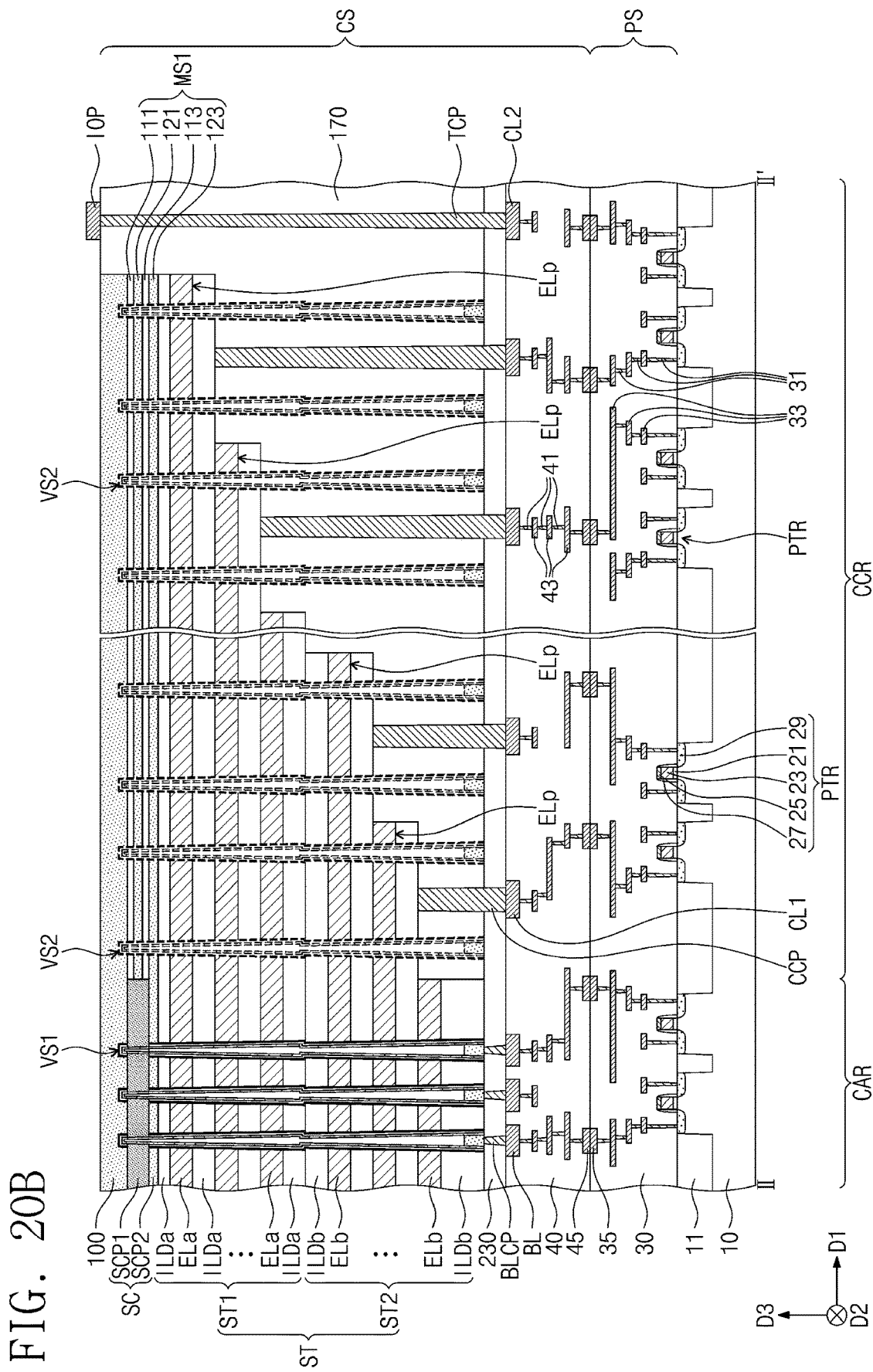

FIG. 19 is a plan view illustrating a three-dimensional semiconductor memory device according to an embodiment of the inventive concept. FIGS. 20A and 20B are sectional views, which are respectively taken along lines I-I' and II-II' of FIG. 19, that illustrate a three-dimensional semiconductor memory device according to an embodiment of the inventive concept. In the following description, an element previously described with reference to FIGS. 5, 6A, and 6B may be identified by the same reference number without repeating an overlapping description thereof, for concise description.

Referring to FIGS. 19, 20A, and 20B, the peripheral circuit structure PS may be provided on the first substrate 10. In an embodiment, the peripheral circuit structure PS may include the peripheral circuit transistors PTR, the peripheral contact plugs 31, the peripheral circuit interconnection lines 33 electrically connected to the peripheral circuit transistors PTR through the peripheral contact plugs 31, first bonding pads 35 electrically connected to the peripheral circuit interconnection lines 33, and the first insulating layer 30 at least partially enclosing the peripheral circuit transistors PTR, the peripheral contact plugs 31, the peripheral circuit interconnection lines 33, and the first bonding pads 35. The first insulating layer 30 may not be on or cover top surfaces of the first bonding pads 35. The first insulating layer 30 may have a top surface that is substantially coplanar with the top surfaces of the first bonding pads 35.

The cell array structure CS including second bonding pads 45, the stack structure ST, and the second substrate 100 may be provided on the peripheral circuit structure PS. The second substrate 100 may be provided on the stack structure ST. The stack structure ST may be provided between the second substrate 100 and the peripheral circuit structure PS.

The second bonding pads 45, connection contact plugs 41, connection circuit interconnection lines 43, and a fourth insulating layer 40 may be provided on the first insulating layer 30. Here, the second bonding pads 45 may be provided to be in physical contact with the first bonding pads 35 of the peripheral circuit structure PS, the connection circuit interconnection lines 43 may be electrically connected to the second bonding pads 45 through the connection contact plugs 41, and the fourth insulating layer 40 may be provided to at least partially enclose the second bonding pads 45, the connection contact plugs 41, and the connection circuit interconnection lines 43. The fourth insulating layer 40 may have a multi-layered structure including a plurality of insulating layers. For example, the fourth insulating layer 40 may be formed of or include at least one of silicon oxide, silicon nitride, silicon oxynitride, and/or low-k dielectric materials. A width of each of the connection contact plugs 41 in the first or second direction D1 or D2 may decrease with increasing distance in the third direction D3 (i.e., with increasing distance from the first substrate 10). The connection contact plugs 41 and the connection circuit interconnection lines 43 may be formed of or include one or more conductive materials (e.g., metallic materials).

The fourth insulating layer 40 may not be on or cover bottom surfaces of the second bonding pads 45. The fourth insulating layer 40 may have a bottom surface that is substantially coplanar with the bottom surfaces of the second bonding pads 45. The bottom surface of each of the second bonding pads 45 may be in direct contact with the top surface of a corresponding one of the first bonding pads 35. The first and second bonding pads 35 and 45 may be formed of or include one or more metallic materials (e.g., copper (Cu), tungsten (W), aluminum (Al), nickel (Ni), and/or tin (Sn)). For example, the first and second bonding pads 35 and 45 may be formed of or include copper (Cu). The first and second bonding pads 35 and 45 may be integrally bonded to each other without any interface therebetween to form a single or monolithic object. The side surfaces of the first and second bonding pads 35 and 45 are illustrated to be aligned to each other, but embodiments of the inventive concept are not limited to this example. For example, the side surfaces of the first and second bonding pads 35 and 45 may be spaced apart from each other, when viewed in a plan view.

The bit lines BL and the first and second conductive lines CL1 and CL2, which are in physical contact with the connection contact plugs 41, may be provided in an upper portion of the fourth insulating layer 40. The third insulating layer 230 may be provided on the fourth insulating layer 40, and the stack structure ST and the second insulating layer 170 may be provided on the third insulating layer 230.

Lengths of the first gate electrodes ELa of the first stack structure ST1 and the second gate electrodes ELb of the second stack structure ST2 in the first direction D1 may increase with increasing distance from the first substrate 10. The side surfaces of the first and second gate electrodes ELa and ELb may be spaced apart from each other by a specific distance in the first direction D1, when viewed in the plan view of FIG. 19. The lowermost one of the second gate electrodes ELb of the second stack structure ST2 may have the smallest length in the first direction D1, and the uppermost one of the first gate electrodes ELa of the first stack structure ST1 may have the largest length in the first direction D1. A length of each of the first and second interlayer dielectric layers ILDa and ILDb in the first direction D1 may increase with increasing distance from the first substrate 10, similar to the first and second gate electrodes ELa and ELb.

For the bit line contact plugs BLCP, the cell contact plugs CCP, the peripheral contact plug TCP, and the first and second vertical channel structures VS1 and VS2, a width in the first or second direction D1 or D2 may decrease with increasing distance in the third direction D3. A width of the separation structure 150 in the second direction D2 may decrease with increasing distance in the third direction D3.

An input/output pad IOP may be provided on the second insulating layer 170, and in an embodiment, the input/output pad IOP may be electrically connected to at least one of the peripheral circuit transistors PTR of the peripheral circuit structure PS through the peripheral contact plug TCP. The input/output pad IOP may correspond to the input/output pad 1101 of FIG. 1 or one of the input/output pads 2210 of FIGS. 3 and 4.

Because the cell array structure CS is coupled to the peripheral circuit structure PS, the three-dimensional semiconductor memory device may have an increased cell capacity per unit area. In addition, the peripheral circuit structure PS and the cell array structure CS may be separately fabricated and then may be coupled to each other, and in this case, it may be possible to reduce the likelihood of or prevent the peripheral circuit transistors PTR from being damaged by several thermal treatment processes. Accordingly, the reliability and electrical characteristics of the three-dimensional semiconductor memory device may be improved.

According to an embodiment of the inventive concept, a barrier pattern may be provided on an inner side surface of each of vertical channel holes, not between interlayer dielectric layers and gate electrodes, and thus, it may be possible to reduce a total thickness of a stack structure and to reduce a size of a three-dimensional semiconductor memory device.

In addition, because sacrificial layers are replaced with the gate electrodes before forming vertical channel structures, it may be possible to reduce the likelihood of or prevent the vertical channel structures from being partially etched when the sacrificial layers are removed. Accordingly, it may be possible to improve reliability and electrical characteristics of the three-dimensional semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
    a substrate including a cell array region and a contact region extending from the cell array region;
    a stack structure including interlayer dielectric layers and gate electrodes alternately and repeatedly stacked on the substrate;
    a source structure between the substrate on the cell array region and the stack structure;
    a mold structure between the substrate on the contact region and the stack structure; and
    first vertical channel structures on the cell array region that are in vertical channel holes penetrating the stack structure and the source structure,
    wherein each of the first vertical channel structures comprises a first barrier pattern, a data storage pattern, and a vertical semiconductor pattern, which are sequentially layered on an inner side surface of a corresponding one of the vertical channel holes,
    wherein the mold structure comprises a first buffer insulating layer, a first semiconductor layer, a second buffer insulating layer, and a second semiconductor layer sequentially stacked on the substrate, and
    wherein the source structure is in physical contact with a portion of a side surface of the vertical semiconductor pattern.

2. The device of claim 1, wherein the first semiconductor layer comprises a material having an etch selectivity with respect to the first barrier pattern.

3. The device of claim 1, wherein the source structure comprises a first source conductive pattern and a second source conductive pattern, which are sequentially stacked on the substrate,
    wherein the first source conductive pattern is in contact with the portion of the side surface of the vertical semiconductor pattern, and
    wherein the first and second semiconductor layers comprise a same material as the second source conductive pattern.

4. The device of claim 3, wherein a bottom surface of the first buffer insulating layer is coplanar with a bottom surface of the first source conductive pattern, and
    wherein a top surface of the second buffer insulating layer is coplanar with a top surface of the first source conductive pattern.

5. The device of claim 1, wherein the first barrier pattern comprises aluminum oxide or hafnium oxide.

6. The device of claim 1, wherein the first vertical channel structures are in physical contact with the substrate.

7. The device of claim 1, further comprising a second barrier pattern between the gate electrodes and the first barrier pattern,
    wherein the second barrier pattern extends on top and bottom surfaces of the gate electrodes, and
    wherein the second barrier pattern comprises a material different from that of the gate electrodes and the first barrier pattern.

8. The device of claim 1, wherein the stack structure is provided in plural, and
    wherein the device further comprises a separation structure, which is in a trench crossing between the stack structures, and a separation spacer, which is in the trench to at least partially enclose the separation structure.

9. The device of claim 8, wherein the separation spacer is between the separation structure and the stack structures, and
    wherein the separation spacer comprises a material having an etch selectivity with respect to the first and second semiconductor layers of the mold structure.

10. The device of claim 1, further comprising second vertical channel structures, which are on the contact region in vertical channel holes penetrating the stack structure and the mold structure,
    wherein each of the second vertical channel structures comprises a first barrier pattern, a data storage pattern, and a vertical semiconductor pattern, which are sequentially layered on an inner side surface of a corresponding one of the vertical channel holes, and
    wherein the first and second buffer insulating layers and the first and second semiconductor layers of the mold structure are spaced apart from the data storage pattern of each of the second vertical channel structures with the first barrier pattern interposed therebetween.

11. A three-dimensional semiconductor memory device, comprising:
    a first substrate including a cell array region and a contact region extending from the cell array region;
    a peripheral circuit structure including peripheral circuit transistors on the first substrate;
    a second substrate on the peripheral circuit structure;
    a stack structure including interlayer dielectric layers and gate electrodes, which are alternately and repeatedly stacked on the second substrate;
    a source structure between the second substrate on the cell array region and the stack structure;
    a mold structure between the second substrate on the contact region and the stack structure;
    first vertical channel structures on the cell array region that are in vertical channel holes penetrating the stack structure and the source structure;
    second vertical channel structures on the contact region that are in vertical channel holes penetrating the stack structure and the mold structure;
    an insulating layer on the stack structure;
    bit line contact plugs on the cell array region that penetrate the insulating layer and are connected to the first vertical channel structures, respectively;
    cell contact plugs on the contact region that penetrate the insulating layer and are connected to the gate electrodes, respectively; and
    a peripheral contact plug that penetrates the insulating layer, is connected to one of the peripheral circuit transistors, and is spaced apart from the second substrate in a first direction generally parallel to a plane defined by the first substrate,
    wherein each of the first and second vertical channel structures comprises a first barrier pattern, a data storage pattern, and a vertical semiconductor pattern, which are sequentially layered on an inner side surface each of the vertical channel holes,
wherein the mold structure comprises a first buffer insulating layer, a first semiconductor layer, a second buffer insulating layer, and a second semiconductor layer, which are sequentially stacked on the second substrate, and
wherein the source structure is in physical contact with a portion of a side surface of the vertical semiconductor pattern of each of the first vertical channel structures.

12. The device of claim 11, wherein each of the vertical channel holes comprises a first vertical channel hole and a second vertical channel hole connected to the first vertical channel hole,
wherein each of the first and second vertical channel structures comprises a first portion, which is in the first vertical channel hole, and a second portion, which is connected to the first portion and is in the second vertical channel hole, and
wherein an uppermost width of the first portion is larger than a lowermost width of the second portion.

13. The device of claim 11, wherein each of the first and second vertical channel structures further comprises an insulating gapfill pattern, which is at least partially enclosed by the vertical semiconductor pattern, and a conductive pad, which is on the insulating gapfill pattern, and
wherein the data storage pattern comprises a blocking insulating layer, a charge storing layer, and a tunneling insulating layer, which are between the first barrier pattern and the vertical semiconductor pattern and extend in a second direction generally perpendicular to a plane defined by the first substrate.

14. The device of claim 11, wherein the stack structure is between the peripheral circuit structure and the second substrate,
wherein a width of each of the first and second vertical channel structures decreases with increasing distance from the first substrate, and
wherein lengths of the gate electrodes increase with increasing distance from the first substrate.

15. The device of claim 11, wherein the cell contact plugs further penetrate the stack structure, the mold structure, and the second substrate and are connected to the peripheral circuit transistors, respectively, and
wherein each of the cell contact plugs is in physical contact with a corresponding one of the gate electrodes and is spaced apart from others of the gate electrodes in the first direction with a first insulating pattern interposed therebetween.

16. The device of claim 15, wherein each of the cell contact plugs is spaced apart from the second substrate in the first direction with a second insulating pattern interposed therebetween, and
wherein the first insulating pattern and the second insulating pattern comprise a same material as the interlayer dielectric layers of the stack structure.

17. The device of claim 15, wherein a bottom surface of each of the cell contact plugs is located at a level lower than a bottom surface of the second substrate with the first substrate providing a base reference plane.

18. An electronic system, comprising:
a three-dimensional semiconductor memory device comprising a first substrate, which includes a cell array region and a contact region extending from the cell array region, a peripheral circuit structure on the first substrate, a cell array structure on the peripheral circuit structure, an insulating layer on the cell array structure, and an input/output pad, which is on the insulating layer and is electrically connected to the peripheral circuit structure; and
a controller, which is electrically connected to the three-dimensional semiconductor memory device through the input/output pad and is configured to control the three-dimensional semiconductor memory device,
wherein the cell array structure comprises:
a second substrate on the peripheral circuit structure;
a stack structure including interlayer dielectric layers and gate electrodes, which are alternately and repeatedly stacked on the second substrate;
a source structure between the second substrate on the cell array region and the stack structure;
a mold structure between the second substrate on the contact region and the stack structure; and
vertical channel structures, which are on the cell array region in vertical channel holes penetrating the stack structure and the source structure,
wherein each of the vertical channel structures comprises a first barrier pattern, a data storage pattern, and a vertical semiconductor pattern, which are sequentially layered on an inner side surface of a corresponding one of the vertical channel holes,
wherein the mold structure comprises a first buffer insulating layer, a first semiconductor layer, a second buffer insulating layer, and a second semiconductor layer, which are sequentially stacked on the second substrate, and
wherein the source structure is in physical contact with a portion of a side surface of the vertical semiconductor pattern.

19. The electronic system of claim 18, wherein the source structure comprises a first source conductive pattern and a second source conductive pattern, which are sequentially stacked on the second substrate,
wherein the first source conductive pattern is in physical contact with a portion of a side surface of the vertical semiconductor pattern of each of the vertical channel structures, and
wherein the first and second semiconductor layers of the mold structure comprise a same material as the second source conductive pattern.

20. The electronic system of claim 18, wherein the peripheral circuit structure comprises peripheral circuit transistors formed on the first substrate and first bonding pads connected to the peripheral circuit transistors,
wherein the cell array structure further comprises:
cell contacts in physical contact with the gate electrodes of the stack structure;
conductive lines connected to the cell contacts;
bit lines connected to the vertical channel structures; and
second bonding pads connected to the conductive lines and the bit lines,
wherein the first and second bonding pads are integrally bonded to each other.

* * * * *

UNITED STATES PATENT AND TRADEMARK OFFICE
CERTIFICATE OF CORRECTION

PATENT NO. : 12,439,597 B2
APPLICATION NO. : 17/652014
DATED : October 7, 2025
INVENTOR(S) : Yong-Hoon Son Page 1 of 1

It is certified that error appears in the above-identified patent and that said Letters Patent is hereby corrected as shown below:

In the Claims

At Column 27, Lines 1-2 (Claim 11):
"which are sequentially layered on an inner side surface each of the vertical channel holes,"
Should read:
--which are sequentially layered on an inner side surface of each of the vertical channel holes,--

Signed and Sealed this
Thirtieth Day of December, 2025

John A. Squires
*Director of the United States Patent and Trademark Office*